United States Patent
Miyahara et al.

(10) Patent No.: US 11,276,521 B2
(45) Date of Patent: Mar. 15, 2022

(54) ELECTRONIC COMPONENT

(71) Applicant: Murata Manufacturing Co., Ltd., Nagaokakyo (JP)

(72) Inventors: Kunihiro Miyahara, Nagaokakyo (JP); Yutaka Masuda, Nagaokakyo (JP); Kanta Motoki, Nagaokakyo (JP); Shoji Nagumo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 408 days.

(21) Appl. No.: 16/288,140

(22) Filed: Feb. 28, 2019

(65) Prior Publication Data
US 2019/0198230 A1 Jun. 27, 2019

Related U.S. Application Data

(63) Continuation of application No. PCT/JP2017/026771, filed on Jul. 25, 2017.

(30) Foreign Application Priority Data

Sep. 9, 2016 (JP) .............................. JP2016-176944

(51) Int. Cl.
*H01F 27/28* (2006.01)
*H01F 17/00* (2006.01)
(Continued)

(52) U.S. Cl.
CPC ..... *H01F 27/2885* (2013.01); *H01F 17/0013* (2013.01); *H01F 27/24* (2013.01);
(Continued)

(58) Field of Classification Search
CPC .. H01F 27/2885; H01F 17/0013; H01F 27/24; H01F 27/2804; H01F 2017/008;
(Continued)

(56) References Cited

U.S. PATENT DOCUMENTS 6,583,687 B2 * 6/2003 Nosaka .................... H03H 7/09
   333/175
2002/0057139 A1  5/2002 Matsumura et al.
(Continued)

FOREIGN PATENT DOCUMENTS

JP  09-121093 A  5/1997
JP  09-205018 A  8/1997
(Continued)

OTHER PUBLICATIONS

Official Communication issued in International Patent Application No. PCT/JP2017/026771 dated Oct. 10, 2017.

*Primary Examiner* — Mang Tin Bik Lian
(74) *Attorney, Agent, or Firm* — Keating & Bennett, LLP

(57) ABSTRACT

An electronic component includes a multilayer body including dielectric layers, a circuit pattern, and band-shaped conductor patterns. The circuit pattern includes a conductor pattern that is disposed inside the multilayer body and defines an inductor. The band-shaped conductor patterns are grounded and cover a portion of a shield surface. An internal surface is located between the circuit pattern and an upper surface. On a shield surface, a non-shielded area is provided which is not covered with any of the band-shaped conductor patterns, and through which magnetic flux generated from the inductor is able to pass.

12 Claims, 14 Drawing Sheets

(51) Int. Cl.
*H03H 7/01* (2006.01)
*H03H 7/03* (2006.01)
*H05K 9/00* (2006.01)
*H01F 27/36* (2006.01)
*H01F 27/24* (2006.01)
*H03H 1/00* (2006.01)
*H01F 27/29* (2006.01)

(52) U.S. Cl.
CPC ....... *H01F 27/2804* (2013.01); *H01F 27/363* (2020.08); *H03H 1/00* (2013.01); *H03H 7/0115* (2013.01); *H03H 7/03* (2013.01); *H03H 7/1725* (2013.01); *H03H 7/1758* (2013.01); *H03H 7/1766* (2013.01); *H05K 9/00* (2013.01); *H01F 27/29* (2013.01); *H01F 2017/008* (2013.01); *H01F 2027/2809* (2013.01); *H03H 2001/0085* (2013.01); *H03H 2001/0092* (2013.01)

(58) Field of Classification Search
CPC .. H01F 27/29; H01F 2027/2809; H01F 27/36; H01F 27/361; H01F 27/363; H01F 27/366; H03H 7/1725; H03H 7/0115; H03H 7/1758; H03H 7/03; H03H 7/1766; H03H 1/00; H03H 2001/0085; H03H 2001/0092; H05K 9/00
See application file for complete search history.

(56) References Cited

U.S. PATENT DOCUMENTS

| | | | |
|---|---|---|---|
| 2004/0233606 A1* | 11/2004 | Inoue | H02H 9/04 361/118 |
| 2009/0051459 A1* | 2/2009 | Miyata | H03H 7/1783 333/25 |
| 2009/0121806 A1* | 5/2009 | Sasaki | H03H 7/1758 333/174 |
| 2010/0033267 A1 | 2/2010 | Mizutani et al. | |
| 2010/0253443 A1* | 10/2010 | Motoyama | H03H 7/422 333/26 |
| 2012/0169434 A1* | 7/2012 | Masuda | H03H 7/1766 333/185 |
| 2015/0097648 A1* | 4/2015 | Kido | H01F 41/046 336/200 |
| 2017/0092414 A1* | 3/2017 | Ishikawa | H01F 27/245 |

FOREIGN PATENT DOCUMENTS

| | | |
|---|---|---|
| JP | 2002-057543 A | 2/2002 |
| JP | 2008-236024 A | 10/2008 |

* cited by examiner

ELECTRONIC COMPONENT

CROSS REFERENCE TO RELATED APPLICATIONS

This application claims the benefit of priority to Japanese Patent Application No. 2016-176944 filed on Sep. 9, 2016 and is a Continuation Application of PCT Application No. PCT/JP2017/026771 filed on Jul. 25, 2017. The entire contents of each of these applications are hereby incorporated herein by reference.

BACKGROUND OF THE INVENTION

1. Field of the Invention

The present invention relates to electronic components including shield electrodes.

2. Description of the Related Art

Electronic components of an integrated circuit are disposed close to each other on a substrate in many cases. Accordingly, in a case in which noise generated inside the electronic component leaks to the outside, the noise may have an unfavorable influence on other electronic components near the noise-source electronic component.

In order to prevent such a situation, a shield electrode is formed on a surface of an electronic component in some cases, as in the case of a shield-type lamination electronic component that is disclosed in Japanese Unexamined Patent Application Publication No. 9-121093.

Noise from the inside or the outside of an electronic component is guided to a ground electrode through a shield electrode. In an electronic component provided with a shield electrode, it is possible to reduce or prevent a situation in which noise enters from the outside, and to reduce or prevent the leakage of magnetic flux to the outside of the electronic component. This type of effect provided by the shield electrode is also referred to as a "shielding effect" hereinafter.

In a case in which an inductor (coil) is formed inside an electronic component, as in a lamination-type low pass filter, for example, magnetic flux is generated from the inductor when a current flows through the inductor. In a case in which this magnetic flux is blocked by one shield electrode that covers substantially the whole area of each of the component surfaces as described in Japanese Unexamined Patent Application Publication No. 9-121093, an eddy current is generated in the shield electrode so that the insertion loss of the electronic component increases, which may cause a Q value of the electronic component to deteriorate. As described above, since the shielding effect and the Q value have a trade-off relationship, it is necessary to appropriately balance the shielding effect and the Q value.

SUMMARY OF THE INVENTION

Preferred embodiments of the present invention reduce or prevent a decrease in Q value while providing the shielding effect.

An electronic component according to a preferred embodiment of the present invention includes a multilayer body including a plurality of dielectric layers. The electronic component includes a circuit pattern and a plurality of band-shaped conductor patterns. The circuit pattern includes a conductor pattern that is disposed inside the multilayer body and defines an inductor. The plurality of band-shaped conductor patterns are grounded. The electronic component includes an upper surface, a lower surface, a side surface, and an internal surface. The lower surface opposes the upper surface. The side surface connects the upper surface and the lower surface. The internal surface is located between the circuit pattern and the upper surface and is parallel or substantially parallel to the upper surface. The plurality of band-shaped conductor patterns cover a portion of a shield surface. The shield surface includes at least one of the upper surface, the side surface, and the internal surface. On the shield surface, a non-shielded area is provided which is not covered with any of the plurality of band-shaped conductor patterns, and through which magnetic flux generated from the inductor is able to pass.

An electronic component according to a preferred embodiment of the present invention includes a multilayer body including a plurality of dielectric layers. The electronic component includes a circuit pattern and a partial shield portion. The circuit pattern includes a conductor pattern that is disposed inside the multilayer body and defines an inductor. The inductor is wound around a winding axis. The partial shield portion is grounded. The electronic component includes an upper surface, a lower surface, a side surface, and an internal surface. The lower surface opposes the upper surface. The side surface connects the upper surface and the lower surface. The internal surface is located between the circuit pattern and the upper surface and is parallel or substantially parallel to the upper surface. The partial shield portion covers a portion of a shield surface. The shield surface includes at least one of the upper surface, the side surface, and the internal surface. On the shield surface, a non-shielded area is provided that is not covered with the partial shield portion. The non-shielded area overlaps with a portion of an air-core section of the inductor in a plan view from a direction of the winding axis of the inductor.

In an electronic component according to a preferred embodiment of the present invention, by disposing a plurality of band-shaped conductor patterns, as shield electrodes, on a shield surface, a non-shielded area that is not covered with the plurality of band-shaped conductor patterns is provided on the shield surface. Accordingly, it is possible to provide an area that blocks and an area that does not block the magnetic flux generated from an inductor inside the electronic component in various shapes on the shield surface. With the electronic component, it is possible to easily perform balance adjustment to reduce or prevent a decrease in Q value while providing the shielding effect.

In an electronic component according to a preferred embodiment of the present invention, in a plan view from the direction of a winding axis of an inductor, a non-shielded area overlaps with a portion of an air-core section of the inductor. Accordingly, the Q value of the electronic component is prevented from deteriorating significantly due to the entire area of the inductor air-core section overlapping with a shield electrode. This makes it possible to reduce or prevent a decrease in Q value while improving the shielding effect in a direction perpendicular or substantially perpendicular to the winding axis of the inductor.

With an electronic component according to a preferred embodiment of the present invention, it is possible to reduce or prevent the decrease in the Q value while ensuring the shielding effect of the electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
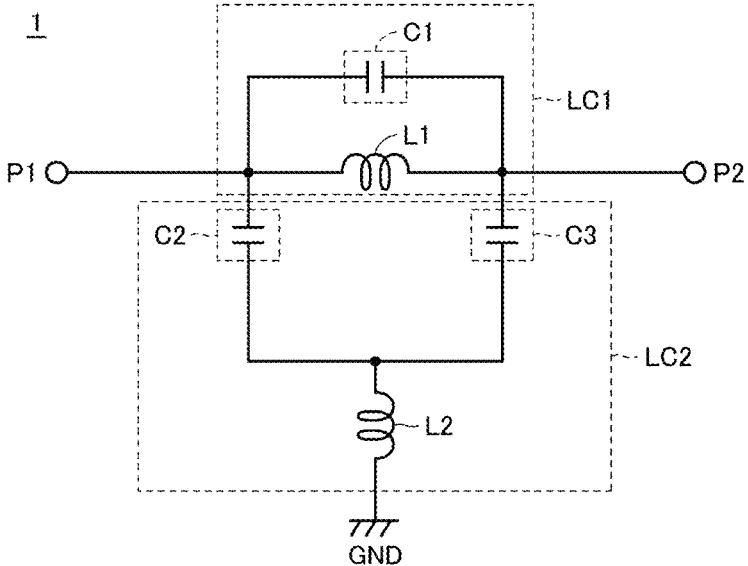
FIG. 1 is a circuit diagram of a low pass filter 1 as an example of an electronic component according to a first preferred embodiment of the present invention.

Hereinafter, preferred embodiments of the present invention will be described in detail with reference to the accompanying drawings. Note that the same or corresponding elements are assigned the same reference signs in the drawings, and description thereof will not be repeated.

First Preferred Embodiment

FIG. 1 is a circuit diagram of a low pass filter 1 as an example of an electronic component according to a first preferred embodiment of the present invention. The low pass filter 1 is an electronic component mounted on a circuit board, and a circuit pattern corresponding to the circuit illustrated in FIG. 1 is provided inside the low pass filter 1. As illustrated in FIG. 1, the low pass filter 1 includes an input-output terminal P1, an input-output terminal P2, an LC parallel resonator LC1, and an LC series resonator LC2.

The LC parallel resonator LC1 includes an inductor L1 and a capacitor C1. The inductor L1 is connected between the input-output terminal P1 and the input-output terminal P2. The capacitor C1 is connected in parallel to the inductor L1, between the input-output terminal P1 and the input-output terminal P2.

The LC series resonator LC2 includes an inductor L2, a capacitor C2, and a capacitor C3. One end of the inductor L2 is connected to a ground point GND. The capacitor C2 is connected between the input-output terminal P1 and the other end of the inductor L2. The capacitor C3 is connected between the input-output terminal P2 and the other end of the inductor L2.

Figure 2:
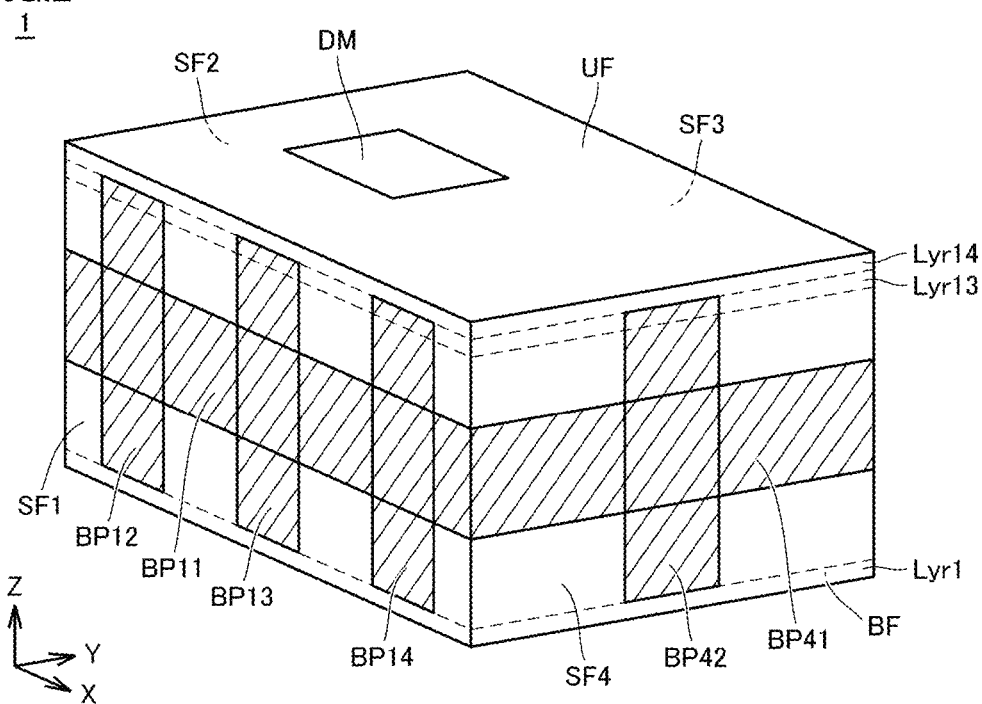
FIG. 2 is an external appearance perspective view of the low pass filter in FIG. 1.
Figure 3:
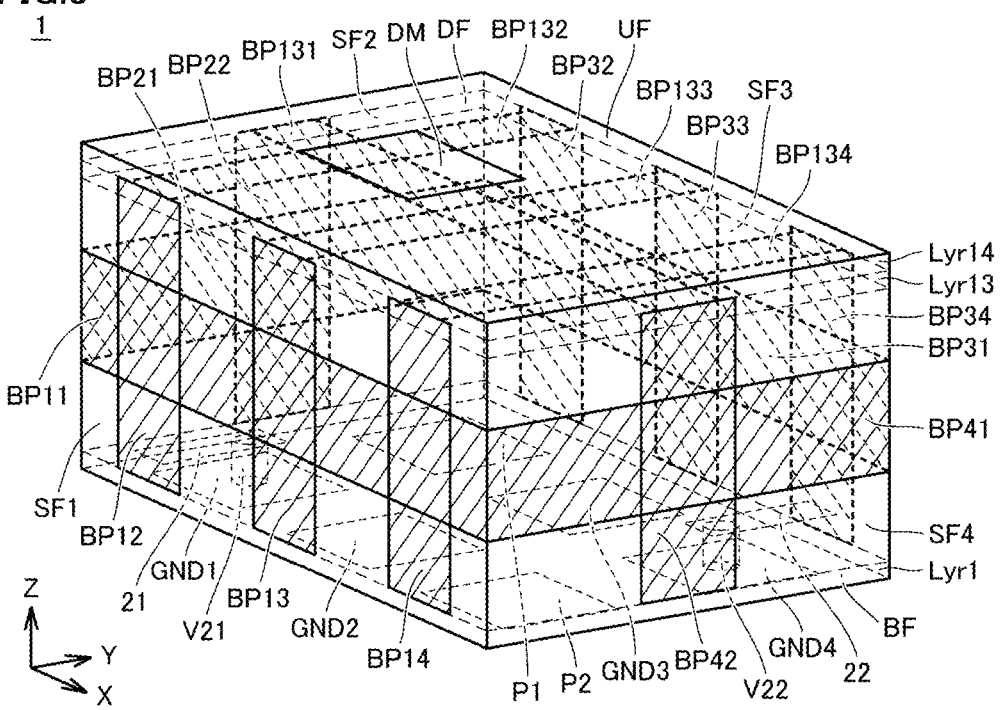
FIG. 3 is an external appearance see-through view of the low pass filter in FIG. 1.

FIG. 2 is an external appearance perspective view of the low pass filter 1 in FIG. 1. FIG. 3 is an external appearance see-through view of the low pass filter 1 in FIG. 1. In FIG. 3, a circuit pattern provided inside the low pass filter 1 is not illustrated in order to prevent the drawing from being complicated. As will be explained later with reference to FIG. 4, the low pass filter 1 is a multilayer body in which a plurality of dielectric layers Lyr1 to Lyr14 are laminated in a Z-axis direction (lamination direction).

As illustrated in FIG. 2 and FIG. 3, the low pass filter 1 preferably has, for example, a rectangular or substantially rectangular parallelepiped shape. Surfaces of the outermost layers perpendicular or substantially perpendicular to the lamination direction of the low pass filter 1 are respectively referred to as a lower surface BF and an upper surface UF. The lower surface BF opposes the upper surface UF. Of the surfaces parallel or substantially parallel to the lamination direction, surfaces parallel or substantially parallel to a Z-X plane are defined as side surfaces SF1 and SF3. Of the surfaces parallel or substantially parallel to the lamination direction, surfaces parallel or substantially parallel to a Y-Z plane are defined as side surfaces SF2 and SF4. The side surfaces SF1 to SF4 connect the upper surface UF and the lower surface BF.

On the lower surface BF, the input-output terminals P1 and P2, and the ground electrodes GND1 to GND4 are provided. The input-output terminals P1 and P2, and the ground electrodes GND1 to GND4 are preferably, for example, land grid array (LGA) terminals defined by planar electrodes that are regularly disposed on the lower surface BF. The low pass filter 1 is mounted on a circuit board (not illustrated) in a state in which the lower surface BF opposes the circuit board.

A direction identification mark DM is provided on the upper surface UF. The direction identification mark DM is disposed to identify the direction of the low pass filter 1 at the mounting time.

An internal surface DF is a surface at which the dielectric layer Lyr14 of the uppermost layer and the dielectric layer Lyr13 of the second layer from the top make contact with each other. On the side surfaces SF1 to SF4 and the internal surface DF, a plurality of band-shaped conductor patterns BP11 to BP14, BP21, BP22, BP31 to BP34, BP41, BP42, and BP131 to BP134 are disposed in a lattice configuration to define shield electrodes. The side surfaces SF1 to SF4 and the internal surface DF correspond to shield surfaces. The shield electrode is not provided on the side surfaces of the dielectric layer Lyr1 including the lower surface BF and the side surfaces of the dielectric layer Lyr14 including the upper surface UF.

With the shield electrode, a situation in which noise from the outside enters into the low pass filter is able to be reduced or prevented and a situation in which magnetic flux radiated from the circuit pattern leaks to the outside is also able to be reduced or prevented. The magnetic flux generated from the inductors L1 and L2 provided inside the low pass filter 1 is able to pass through an area (non-shielded area) that is not covered with any of the band-shaped conductor patterns.

In the first preferred embodiment, the non-shielded area is provided on the internal surface DF defining a shield surface that is seen in a plan view from the winding axis direction of the inductor L1 (Z-axis direction), and is also provided on the side surfaces SF1 to SF4 defining shield surfaces that are seen in plan views from directions perpendicular or substantially perpendicular to the winding axis of the inductor L1 (an X-axis direction and a Y-axis direction).

The band-shaped conductor patterns BP11 to BP14 are disposed on the side surface SF1. The band-shaped conductor pattern BP11 extends in the X-axis direction. The band-shaped conductor patterns BP12 to BP14 are spaced away from each other in the X-axis direction. Each of the band-shaped conductor patterns BP12 to BP14 extends in the Z-axis direction. Each of the band-shaped conductor patterns BP12 to BP14 preferably defines a cross shape with the band-shaped conductor pattern BP11 in a plan view from the Y-axis direction. The band-shaped conductor pattern BP12 is connected to the ground electrode GND1 via a line conductor pattern 21 and a via conductor pattern V21.

On the side surface SF2, the band-shaped conductor patterns BP21 and BP22 are provided. The band-shaped conductor pattern BP21 extends in the Y-axis direction and is connected to the band-shaped conductor pattern BP11. The band-shaped conductor pattern BP22 extends in the Z-axis direction. In a plan view from the X-axis direction, the band-shaped conductor pattern BP22 preferably defines a cross shape with the band-shaped conductor pattern BP21.

The band-shaped conductor patterns BP31 to BP34 are disposed on the side surface SF3. The band-shaped conductor pattern BP31 extends in the X-axis direction and is connected to the band-shaped conductor pattern BP21. The band-shaped conductor patterns BP32 to BP34 are spaced away from each other in the X-axis direction. Each of the band-shaped conductor patterns BP32 to BP34 extends in the Z-axis direction. Each of the band-shaped conductor patterns BP32 to BP34 preferably defines a cross shape with the band-shaped conductor pattern BP31 in a plan view from the Y-axis direction. The band-shaped conductor pattern BP34 is connected to the ground electrode GND4 via a line conductor pattern 22 and a via conductor pattern V22.

On the side surface SF4, the band-shaped conductor patterns BP41 and BP42 are disposed. The band-shaped conductor pattern BP41 extends in the Y-axis direction and is connected to the band-shaped conductor patterns BP11 and BP31. The band-shaped conductor pattern BP42 extends in the Z-axis direction. The band-shaped conductor pattern BP42 preferably defines a cross shape with the band-shaped conductor pattern BP41.

The band-shaped conductor patterns BP131 to BP134 are disposed on the internal surface DF. The band-shaped conductor pattern BP131 extends in the X-axis direction and is connected to the band-shaped conductor patterns BP22 and BP42. Each of the band-shaped conductor patterns BP132 to BP134 extends in the Y-axis direction. Each of the band-shaped conductor patterns BP132 to BP134 preferably defines a cross shape with the band-shaped conductor pattern BP131. The band-shaped conductor pattern BP132 is connected to the band-shaped conductor patterns BP12 and BP32. The band-shaped conductor pattern BP133 is connected to the band-shaped conductor patterns BP13 and BP33. The band-shaped conductor pattern BP134 is connected to the band-shaped conductor patterns BP14 and BP34.

Figure 4:
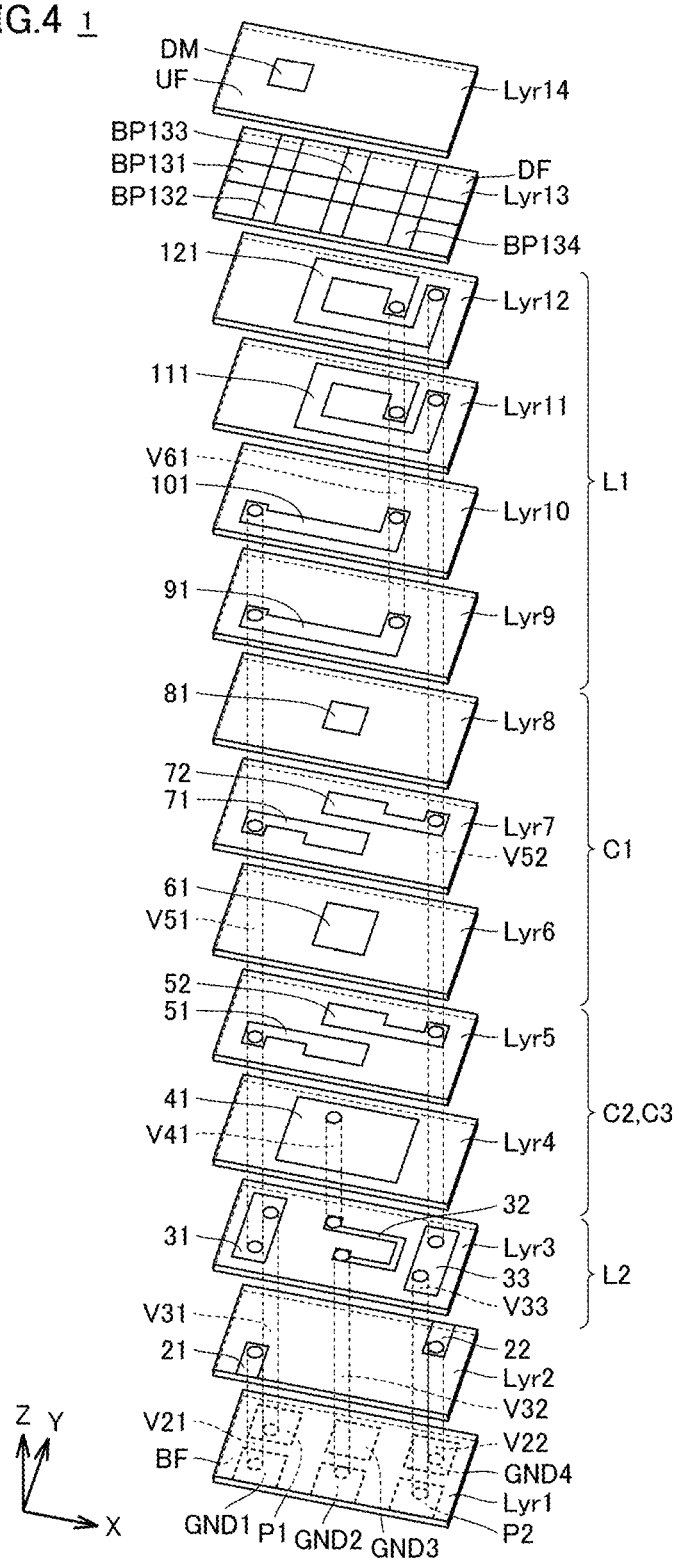
FIG. 4 is an exploded perspective view illustrating a lamination structure of the low pass filter in FIG. 1.

FIG. 4 is an exploded perspective view illustrating a lamination structure of the low pass filter 1 in FIG. 1. The low pass filter 1 is a multilayer body including a plurality of dielectric layers. The low pass filter 1 includes the dielectric layers Lyr1 to Lyr14 as the plurality of dielectric layers. The dielectric layers are laminated in order in the z-axis direction so that the dielectric layer Lyr1 is disposed on the lower surface BF side and the dielectric layer Lyr14 is disposed on the upper surface UF side. A dielectric constant of each of the dielectric layers Lyr1 to Lyr14 is identical or substantially identical so as to facilitate the design and manufacture of the low pass filter 1.

As discussed above, the input-output terminals P1 and P2, and the ground electrodes GND1 to GND4 are provided on the lower surface BF of the dielectric layer Lyr1.

On the dielectric layer Lyr2, the line conductor pattern and the line conductor pattern 22 are provided. The line conductor pattern 21 is connected to the ground electrode GND1 by the via conductor pattern V21. The line conductor pattern 22 is connected to the ground electrode GND4 by the via conductor pattern V22.

On the dielectric layer Lyr3, line conductor patterns 31 to 33 are provided. The line conductor pattern 31 is connected to the input-output terminal P1 by a via conductor pattern V31. The line conductor pattern 32 is connected to the ground electrode GND2 by a via conductor pattern V32. The line conductor pattern 33 is connected to the input-output terminal P2 by a via conductor pattern V33. The line conductor pattern 32 defines the inductor L2. The inductor L2 is wound around the winding axis parallel or substantially parallel to the lamination direction.

A capacitor conductor pattern 41 is provided on the dielectric layer Lyr4. The capacitor conductor pattern 41 is connected to the line conductor pattern 32 by a via conductor pattern V41.

Capacitor conductor patterns 51 and 52 are provided on the dielectric layer Lyr5. The capacitor conductor pattern 51 is connected to the line conductor pattern 31 by a via conductor pattern V51. The capacitor conductor pattern 52 is connected to the line conductor pattern 33 by a via conductor pattern V52.

In a plan view from the lamination direction, each of the capacitor conductor patterns 51 and 52 overlaps with the capacitor conductor pattern 41. The capacitor conductor patterns 41 and 51 define the capacitor C2. The capacitor conductor patterns 41 and 52 define the capacitor C3.

A capacitor conductor pattern 61 is provided on the dielectric layer Lyr6. Capacitor conductor patterns 71 and 72 are provided on the dielectric layer Lyr7. The capacitor conductor pattern 71 is connected to the capacitor conductor pattern 51 by the via conductor pattern V51. The capacitor conductor pattern 72 is connected to the capacitor conductor pattern 52 by the via conductor pattern V52. A capacitor conductor pattern 81 is provided on the dielectric layer Lyr8.

In a plan view from the lamination direction, each of the capacitor conductor patterns 71 and 72 overlaps with the capacitor conductor pattern 61. In the plan view from the lamination direction, the capacitor conductor pattern 81 overlaps with the capacitor conductor patterns 71 and 72. The capacitor conductor patterns 61, 71, 72, and 81 define the capacitor C1.

A line conductor pattern 91 is provided on the dielectric layer Lyr9. The line conductor pattern 91 is connected to the capacitor conductor pattern 71 by the via conductor pattern V51. A line conductor pattern 101 is provided on the dielectric layer Lyr10. The line conductor pattern 101 is connected to the line conductor pattern 91 by the via conductor pattern V51 and a via conductor pattern V61.

A line conductor pattern 111 is provided on the dielectric layer Lyr11. The line conductor pattern 111 is connected to the line conductor pattern 101 by the via conductor pattern V61. The line conductor pattern 111 is connected to the capacitor conductor pattern 72 by the via conductor pattern V52.

A line conductor pattern 121 is provided on the dielectric layer Lyr12. The line conductor pattern 121 is connected to the line conductor pattern 111 by the via conductor patterns V52 and V61. The line conductor patterns 91, 101, 111 and 121 define the inductor L1. The inductor L1 is wound around the winding axis parallel or substantially parallel to the lamination direction.

The circuit patterns corresponding to the circuit illustrated in FIG. 1 are provided on the dielectric layers Lyr1 to Lyr12.

As described earlier, the band-shaped conductor patterns BP131 to BP134 are provided on the internal surface DF of the dielectric layer Lyr13. The internal surface DF is located between the upper surface UF and the circuit pattern, and is parallel or substantially parallel to the upper surface UF.

As described above, the direction identification mark DM is provided on the upper surface UF of the dielectric layer Lyr14.

Figure 5A:
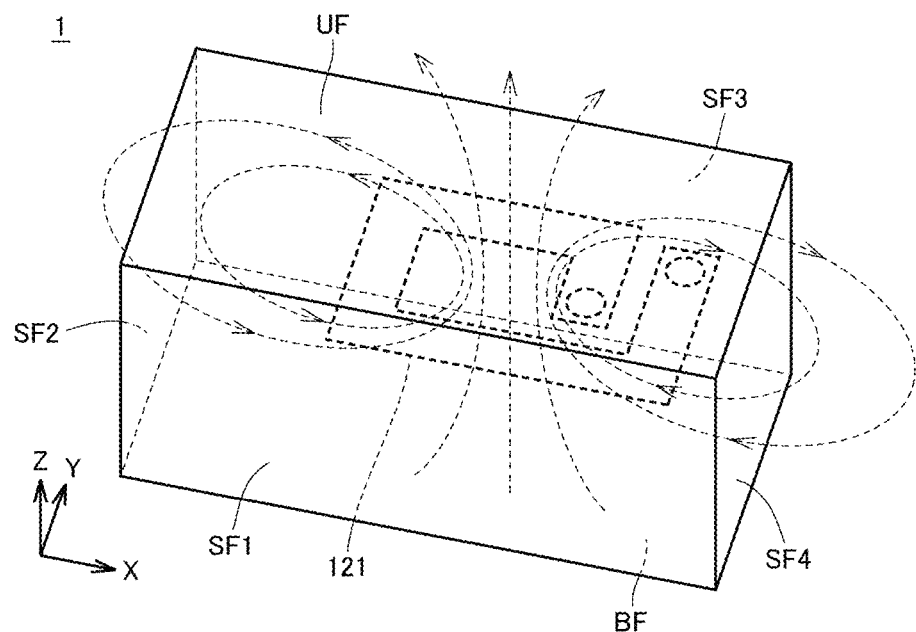
FIGS. 5A and 5B include diagrams schematically depicting magnetic flux generated from an inductor.
Figure 5B:
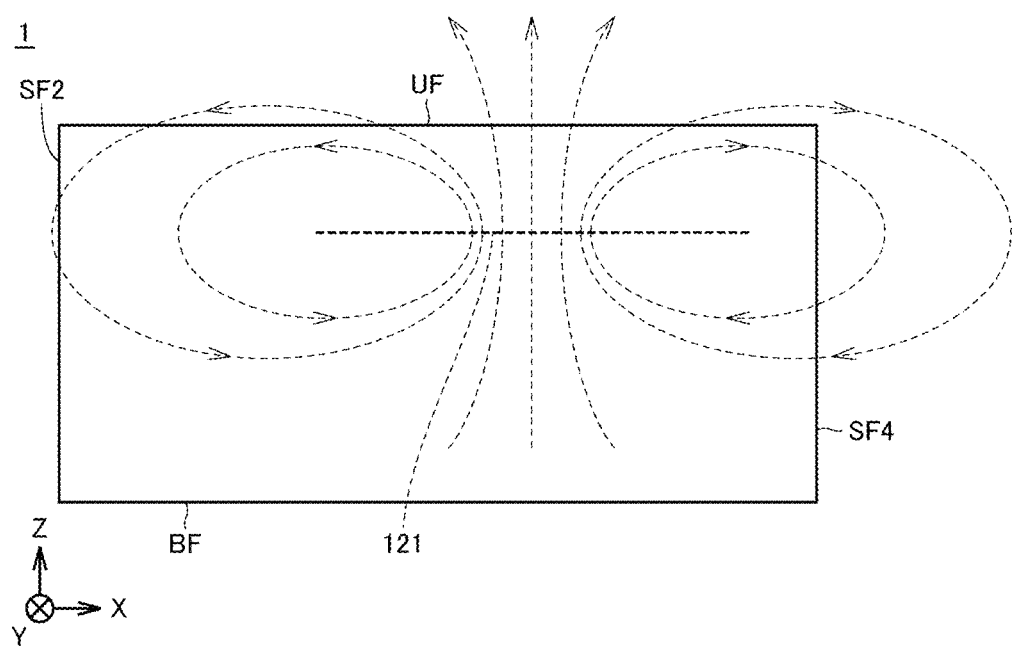

FIGS. 5A and 5B include diagrams schematically depicting the magnetic flux generated from the inductor L1. In FIGS. 5A and 5B, in order to clearly depict a state in which the magnetic flux is generated from the inductor L1, the shield electrode is not illustrated, and only the line conductor pattern 121 of the inductor L1 among the circuit patterns is illustrated. FIG. 5A is an external appearance perspective view of the low pass filter 1. FIG. 5B is a plan view of the low pass filter 1 in the Y-axis direction.

The lower surface of the electronic component is connected to a circuit board in close contact with the circuit board. Because of this, the magnetic flux from the inside of the electronic component is likely to leak to the outside through a surface other than the lower surface. In addition, noise from the outside of the electronic component is likely to enter the inside thereof through a surface other than the lower surface. As depicted in FIGS. 5A and 5B, in the low pass filter 1, the magnetic flux is likely to leak to the outside through the upper surface UF perpendicular or substantially perpendicular to the winding axis of the inductor L1 and through the side surfaces SF1 to SF4 that are parallel or substantially parallel to the winding axis. As such, by disposing the shield electrode on the upper surface UF or the internal surface between the upper surface UF and the circuit pattern, and the side surfaces SF1 to SF4, it is possible to reduce or prevent the leakage of the magnetic flux from the low pass filter 1 to the outside. In addition, with the shield electrode, it is possible to reduce or prevent a situation in which noise enters into the inside of the low pass filter 1 from the outside.

To reduce the influence of the noise from the outside on the electronic component and on electronic components of other devices, it is preferable to cover as large an area as possible with the shield electrode. However, when the magnetic flux from the inductor L1 is blocked by the shield electrode, an eddy current is generated in the shield electrode and the insertion loss of the low pass filter 1 is increased, so that the Q value of the low pass filter 1 deteriorates. This may degrade the characteristics of the low pass filter 1. As described above, since the shielding effect and the Q value have a trade-off relationship, it is necessary to appropriately balance the shielding effect and the Q value.

In the first preferred embodiment, a plurality of band-shaped conductor patterns are provided in a lattice configuration, as shield electrodes, on the internal surface DF and on each of the side surfaces SF1 to SF4. On the internal surface DF and each of the side surface SF1 to SF4, a non-shielded area is provided which is not covered with any shield electrode, and through which the magnetic flux from the inductor inside the low pass filter 1 is able to pass. Due to the non-shielded area being provided, a situation in which the magnetic flux is blocked by the shield electrode is reduced or prevented as compared with a case in which the entire area of the shield surface is covered with the shield electrode. As a result, it is possible to obtain the balance between the shielding effect and the Q value, and to reduce or prevent the decrease in the Q value while ensuring the shielding effect.

Figure 6A:
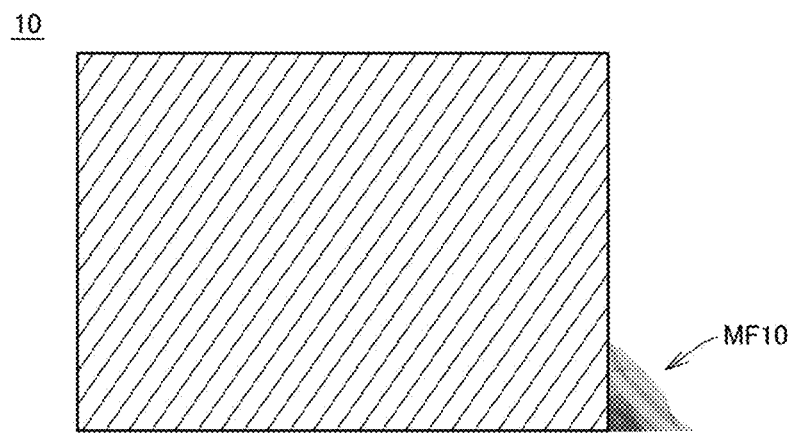
FIGS. 6A to 6C show simulation results each depicting a state in which magnetic flux from the inside of a low pass filter leaks to the outside.
Figure 6B:
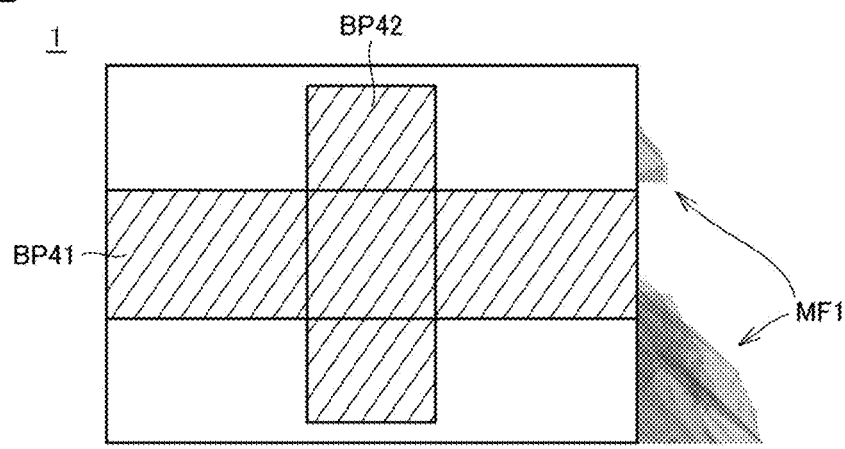
Figure 6C:
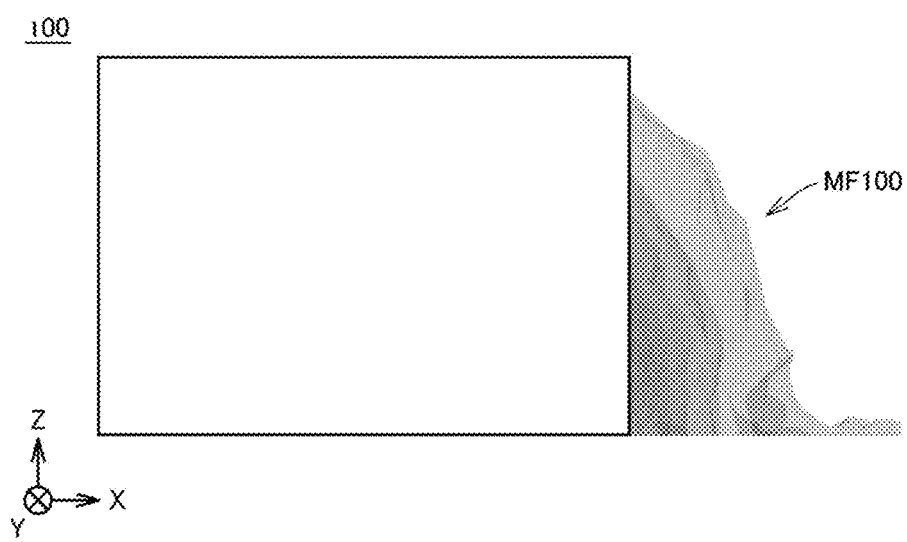

FIGS. 6A to 6C show simulation results each depicting a state in which magnetic flux from the inside of a low pass filter leaks to the outside. In each of the diagrams in FIGS. 6A to 6C, a state in which magnetic flux leaks to the outside is depicted with regard to one side surface parallel or substantially parallel to the Y-Z plane. FIG. 6A is a simulation result of a low pass filter 10 as an example of an electronic component according to a Comparative Example 1. In the low pass filter 10, the entire area of the surfaces other than the lower surface is covered with a shield electrode. FIG. 6B is a simulation result of the low pass filter 1 in FIG. 2. FIG. 6C is a simulation result of a low pass filter 100 as an example of an electronic component according to a Comparative Example 2. In the low pass filter 100, a shield electrode is not disposed on each surface. Inside the low pass filters 10 and 100, circuit patterns similar to those of the low pass filter 1, as illustrated in FIG. 4, are provided.

When the sizes of the areas covered with the shield electrodes of the low pass filter 1, the low pass filter 10, and the low pass filter 100 are compared, the size becomes smaller in the order of the low pass filter 10, the low pass filter 1, and the low pass filter 100. As the area covered with the shield electrode becomes smaller, the amount of magnetic flux that leaks to the outside becomes larger.

As depicted in FIGS. 6(*a*) to 6(*c*), magnetic flux MF10, magnetic flux MF1, and magnetic flux MF 100 leak to the outside from the low pass filter 10, the low pass filter 1 and the low pass filter 100, respectively. The amount of magnetic flux that leaks to the outside increases in the order of the low pass filter 10, the low pass filter 1, and the low pass filter 100 (magnetic flux MF10<magnetic flux MF1<magnetic flux MF100).

On the other hand, as the area covered with the shield electrode becomes smaller, an eddy current generated in the shield electrode becomes smaller. As the eddy current decreases, the insertion loss decreases accordingly so that a Q value becomes higher. Accordingly, when the Q values are compared, the value becomes higher in the order of the low pass filter 10, the low pass filter 1, and the low pass filter 100.

In the low pass filter 1, both of the Q value and the amount of magnetic flux leaking to the outside have intermediate values between those of the low pass filter 10 and the low pass filter 100. The low pass filter 1 is able to balance the shielding effect and the Q value, and is able to reduce or prevent the decrease in the Q value while ensuring the shielding effect.

The magnetic flux from the inductor is concentrated in the air-core section of the inductor. Because of this, in the case in which the air-core section of the inductor is closed by the shield electrode in a plan view of the inductor from the winding axis direction (the lamination direction in the first preferred embodiment), a large eddy current is generated in the shield electrode, and the Q value is significantly lowered in some case. Accordingly, in the case in which the leakage of magnetic flux in the winding axis direction of the inductor is allowed to some extent, it is possible to effectively reduce or prevent the decrease in the Q value by reducing the shield electrode that overlaps with the air-core section of the inductor to decrease an unnecessary shielding effect.

Figure 7:
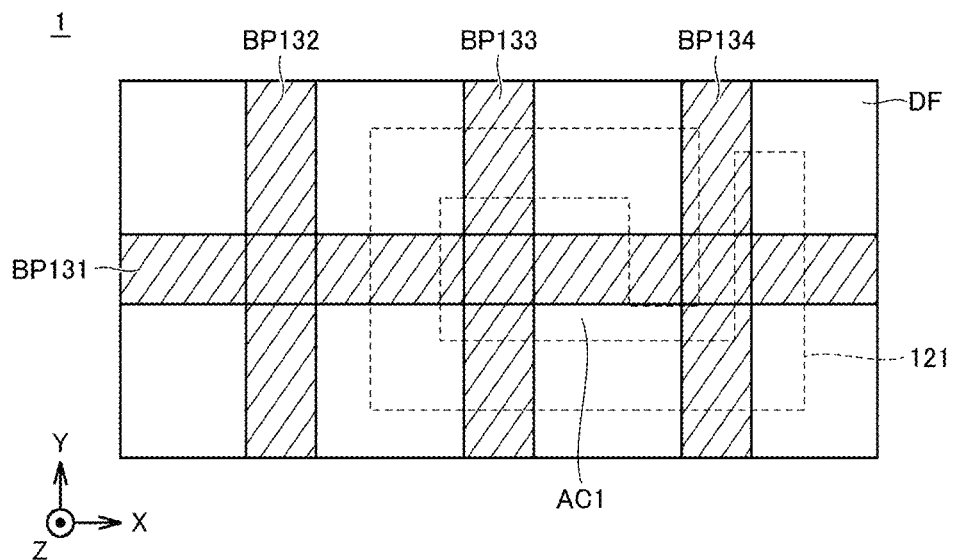
FIG. 7 is a diagram illustrating a see-through view of the low pass filter in FIG. 2 in a plan view from a winding axis direction (lamination direction) of an inductor.

FIG. 7 is a diagram illustrating a see-through view of the low pass filter 1 in FIG. 2 in a plan view from the winding axis direction (lamination direction) of the inductor L1. As illustrated in FIG. 7, in the low pass filter 1, a portion of an air-core section AC1 of the inductor L1 overlaps with a non-shielded area that is not covered with the band-shaped conductor patterns BP131 to BP134. In the first preferred embodiment, in the case in which the leakage of magnetic flux in the winding axis direction of the inductor L1 is allowed to some extent, it is possible to effectively reduce or prevent the decrease in the Q value.

Noise from the inside or the outside of the electronic component is guided to the ground electrode through the shield electrode. In a case in which a plurality of ground electrodes are provided, if the length of a path from a certain ground electrode to another ground electrode is equal or substantially equal to half of an effective wavelength of assumed noise (e.g., noise having a frequency of about 6 GHz), the stated path may act as a loop antenna so that the noise may be taken in. The effective wavelength of noise has a value obtained by dividing a wavelength of the noise (for example, about 5 cm in the case of a frequency being about 6 GHz) by a dielectric constant of the dielectric layer. Then, in the low pass filter 1, in order to prevent a path from the ground electrode GND1 to the ground electrode GND4 from acting as a loop antenna, the size of the low pass filter 1, and the configuration and length of the plurality of band-shaped conductor patterns are preferably designed so that the length of the path is, for example, smaller than about half of the effective wavelength of the assumed noise.

Figure 8:
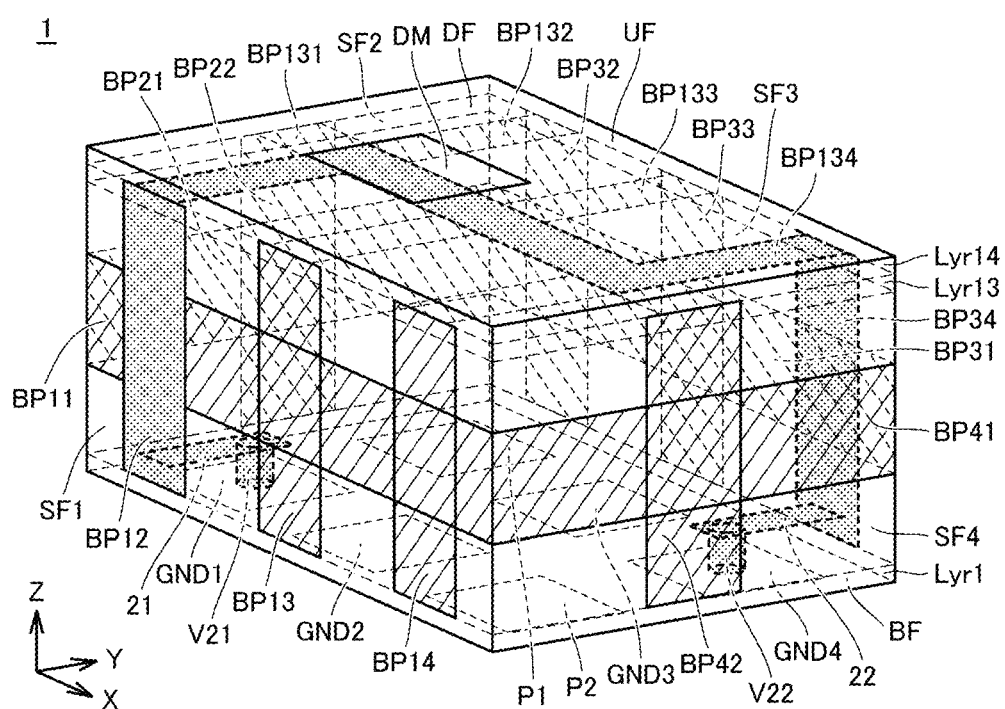
FIG. 8 is a diagram for explaining an example of a path from a ground electrode to another ground electrode in a low pass filter.

FIG. 8 is a diagram in which one of the paths from the ground electrode GND1 to the ground electrode GND4 is highlighted and illustrated in the low pass filter 1. In the low pass filter 1, the size of the low pass filter 1, and the configuration and length of the plurality of band-shaped conductor patterns are preferably designed so that the length of the longest path from the ground electrode GND1 to the ground electrode GND4 is preferably smaller than about half of the effective wavelength of the assumed noise. Because of this, the path from the ground electrode GND1 to the ground electrode GND4 is reduced or prevented from acting as a loop antenna. As a result, a situation in which the path from the ground electrode GND1 to the ground electrode GND4 acts as an antenna so that the noise is taken in, is able to be reduced or prevented.

As described thus far, in the first preferred embodiment, by providing band-shaped conductor patterns as shield electrodes in a lattice configuration, non-shielded areas are provided on the shield surfaces. By appropriately selecting the configuration of the band-shaped conductor patterns, it is possible to balance the shielding effect and the Q value, and to reduce or prevent the decrease in the Q value while ensuring the shielding effect.

Further, in the first preferred embodiment, in a plan view from the winding axis direction of the inductor, the plurality of band-shaped conductor patterns do not cover the entire area of the air-core section of the inductor. A portion of the air-core section overlaps with the non-shielded area. According to the first preferred embodiment, since the leakage of magnetic flux in the winding axis direction of the inductor is allowed to some extent, the decrease in the Q value is able to be reduced or prevented.

Further, in the first preferred embodiment, the length of a path from a certain ground electrode to another ground electrode is preferably set to be, for example, smaller than about half of the effective wavelength of assumed noise. With this, the stated path is prevented from acting as a loop antenna. As a result, it is possible to prevent noise from being taken in by the path.

Figure 9:
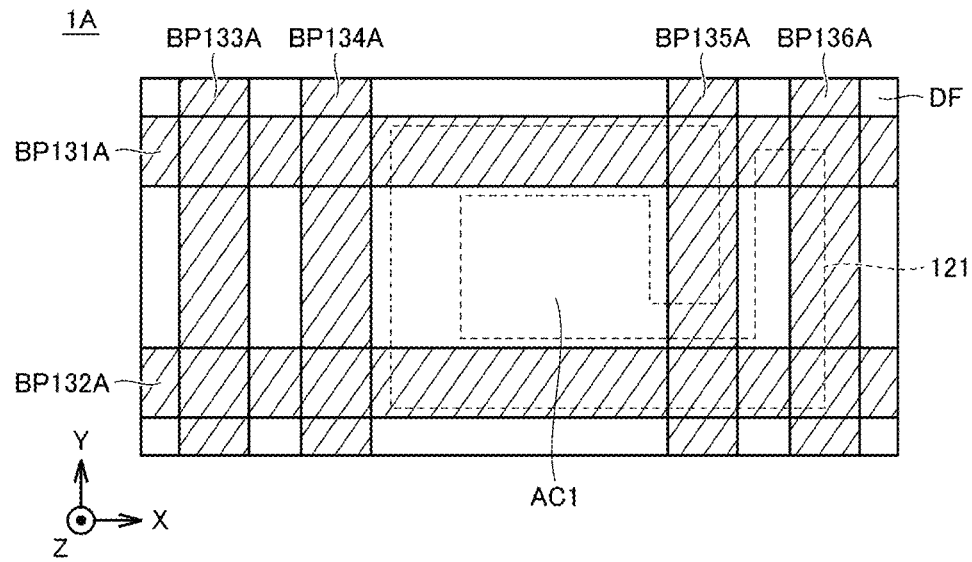
FIG. 9 is a diagram illustrating a see-through view of a low pass filter as an example of an electronic component according to a Modification 1 of the first preferred embodiment, in a plan view from a winding axis direction (lamination direction) of an inductor.

From the standpoint of reducing or preventing a decrease in Q value, it is preferable that the entire or substantially the entire area of the air-core section of the inductor does not overlap with the shield electrode but overlaps with the non-shielded area. FIG. 9 is a diagram illustrating a see-through view of a low pass filter 1A as an example of an electronic component according to a Modification 1 of the first preferred embodiment, in a plan view from the winding axis direction (lamination direction) of the inductor L1. As illustrated in FIG. 9, the air-core section AC1 of the inductor L1 does not overlap with band-shaped conductor patterns BP131A to BP136A disposed on the internal surface DF, and the entire or substantially the entire area of the air-core section AC1 overlaps with the non-shielded area. According to the Modification 1 of the first preferred embodiment, it is possible to further reduce or prevent the decrease in the Q value due to the magnetic flux being blocked by the shield electrode disposed on the surface parallel or substantially parallel to the winding axis of the inductor.

In a case in which there is only one ground electrode to which each of the band-shaped electrode patterns is connected, if the length of a path from the ground electrode to an open end (open stub) of the band-shaped conductor pattern is equal or substantially equal to a quarter of the effective wavelength of assumed noise, the stated path may act as a dipole antenna so that the noise may be taken in. Therefore, it is preferable that the length of the longest path from the ground electrode to the open end (open stub) of the band-shaped conductor pattern is, for example, smaller than about a quarter of the effective wavelength of the assumed noise.

Figure 10:
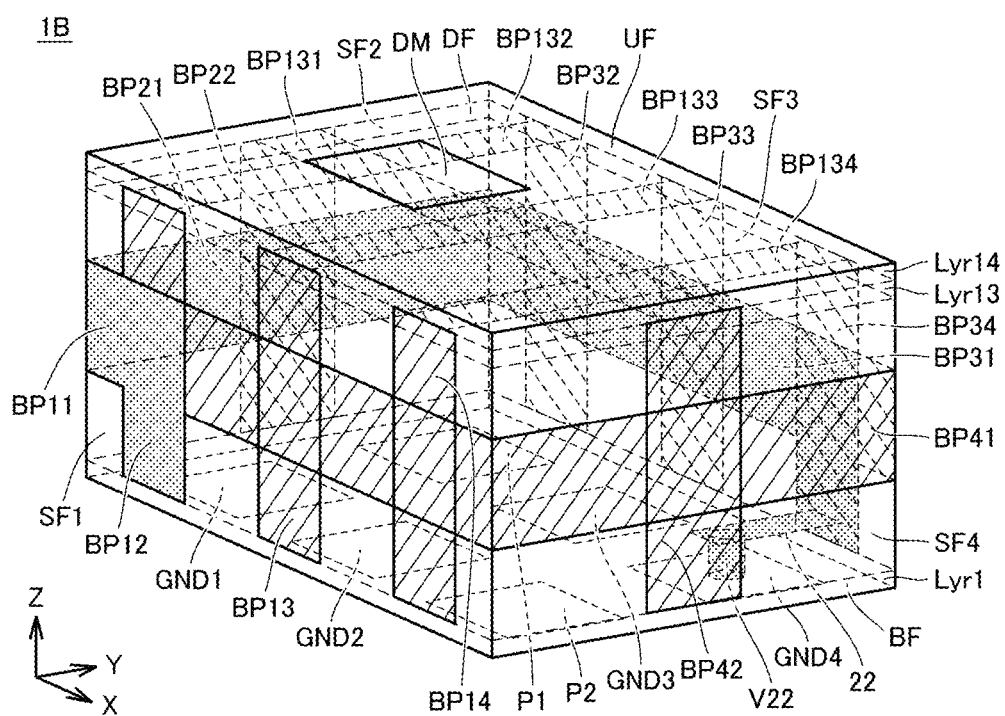
FIG. 10 is a diagram for explaining an example of a path from a ground electrode to an open end of a band-shaped conductor pattern in a low pass filter as an example of an electronic component according to a Modification 2 of the first preferred embodiment of the present invention.

FIG. 10 is a diagram in which one of the paths from a ground electrode to an open end of a band-shaped conductor pattern is highlighted and illustrated, in a low pass filter 1B as an example of an electronic component according to a Modification 2 of the first preferred embodiment. In the low pass filter 1B, unlike the low pass filter 1, the band-shaped conductor pattern BP14 is not connected to the ground electrode GND1. In the low pass filter 1B, each of the band-shaped conductor patterns is connected to the ground electrode GND4.

FIG. 10 illustrates a path from the ground electrode GND4 to an open end of the band-shaped conductor pattern BP12 via the band-shaped conductor patterns BP41, BP21 and BP11. In the low pass filter 1B, in order to prevent the above path from acting as a dipole antenna, the size of the low pass filter 1B, and the configuration and length of the plurality of band-shaped conductor patterns are preferably designed so that the length of the path is, for example, smaller than about a quarter of the effective wavelength of the assumed noise. As a result, it is possible to prevent the noise from being taken in by the path from the ground electrode to the open end of the band-shaped conductor pattern.

In the first preferred embodiment, the plurality of band-shaped conductor patterns are disposed on the internal surface DF located between the upper surface UF and the circuit pattern. The plurality of band-shaped conductor patterns may not be disposed on the internal surface DF, but may be disposed on the upper surface UF.

Figure 11:
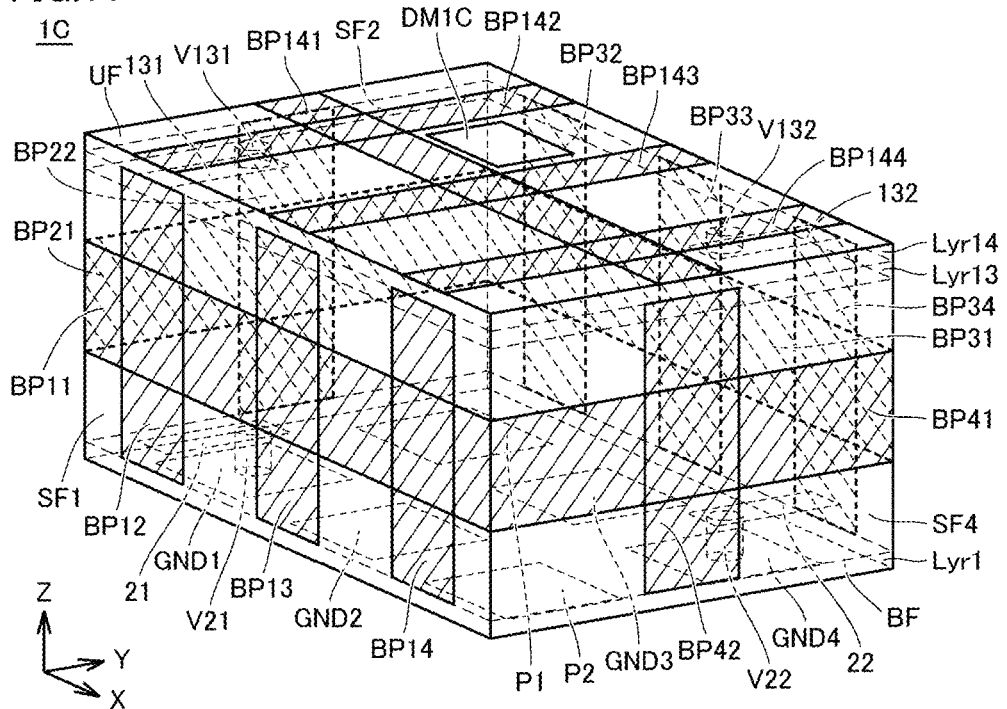
FIG. 11 is an external appearance perspective view of a low pass filter as an example of an electronic component according to a Modification 3 of the first preferred embodiment of the present invention.

FIG. 11 is an external appearance perspective view of a low pass filter 1C as an example of an electronic component according to a Modification 3 of the first preferred embodiment. As illustrated in FIG. 11, band-shaped conductor patterns BP141 to BP144 and a direction identification mark DM1C are provided on an upper surface UF of the low pass filter 1C. The band-shaped conductor pattern BP141 extends in the X-axis direction. The band-shaped conductor patterns BP142 to BP144 are spaced away from each other in the X-axis direction. Each of the band-shaped conductor patterns BP142 to BP144 extends in the Y-axis direction. Each of the band-shaped conductor patterns BP142 to BP144 defines a cross shape with the band-shaped conductor pattern BP141 in a plan view from the Z-axis direction. The band-shaped conductor pattern BP142 is connected to the band-shaped conductor pattern BP12 via a via conductor pattern V131 and a line conductor pattern 131 inside the low pass filter 1C. The band-shaped conductor pattern BP144 is connected to the band-shaped conductor pattern BP34 via a via conductor pattern V132 and a line conductor pattern 132 inside the low pass filter 1C. The direction identification mark DM1C is so disposed so as not to overlap with the band-shaped conductor patterns BP141 to BP144.

As in the low pass filter 1C, the plurality of band-shaped conductor patterns may be disposed on the upper surface UF. By disposing the plurality of band-shaped conductor patterns on the upper surface UF, a distance between the dielectric layer on which the circuit pattern is provided and the shield surface perpendicular or substantially perpendicular to the lamination direction are able to be larger than that in the case in which the plurality of band-shaped conductor patterns are disposed on the internal surface DF. As a result, it is possible to further reduce or prevent the decrease in the Q value of the electronic component.

In the first preferred embodiment, the plurality of band-shaped conductor patterns are disposed on both of the side surfaces SF1 to SF4 and the internal surface DF, and the non-shielded area is provided on each of the surfaces other than the lower surface BF. It is not necessary that the non-shielded area is provided on each of the surfaces other than the lower surface BF. That is, it is sufficient that the plurality of band-shaped conductor patterns are disposed on any of the surfaces other than the lower surface BF, and the non-shielded area is provided on such surfaces.

Figure 12:
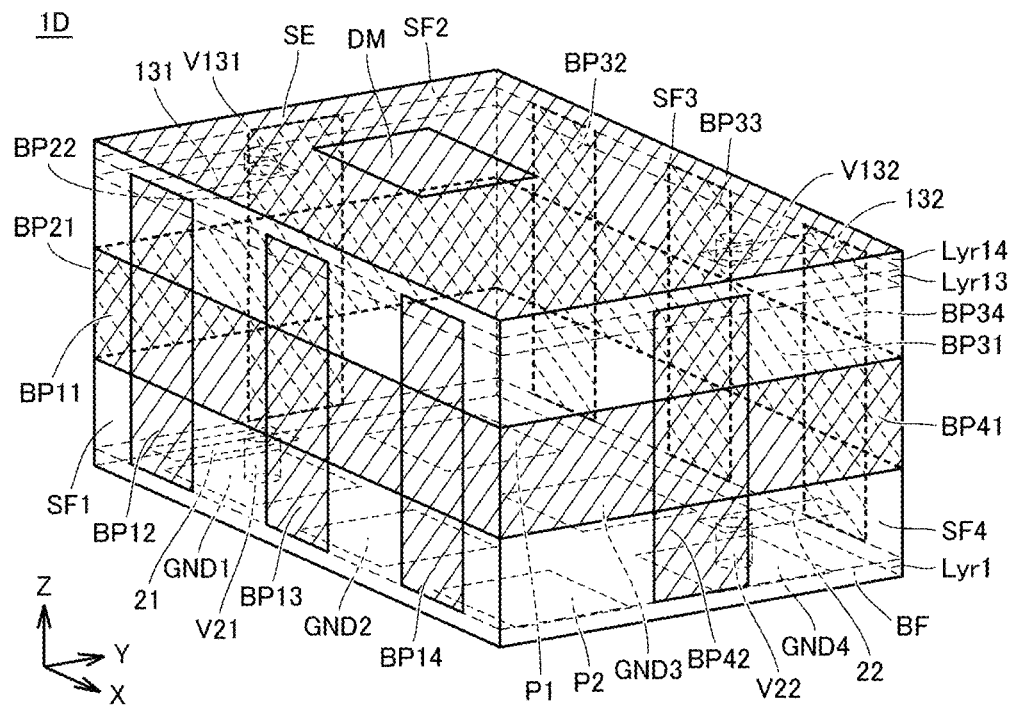
FIG. 12 is an external appearance perspective view of a low pass filter as an example of an electronic component according to a Modification 4 of the first preferred embodiment of the present invention.

For example, as in a low pass filter 1D illustrated in FIG. 12, a plurality of band-shaped conductor patterns are disposed in a lattice configuration on the side surfaces SF1 to SF4 and non-shielded areas are provided thereon. On the other hand, the entire or substantially the entire area of the upper surface UF may be covered with a shield electrode SE, and a non-shielded area may not be provided on the upper surface UF. It is assumed that the low pass filter 1D is disposed close to other electronic components located in the Z-axis direction, for example, and it is necessary to reduce or prevent the entering of noise from the Z-axis direction or the leakage of magnetic flux as required as much as possible. Therefore, the entire or substantially the entire area of the upper surface UF may preferably be covered with the shield electrode SE.

Figure 13:
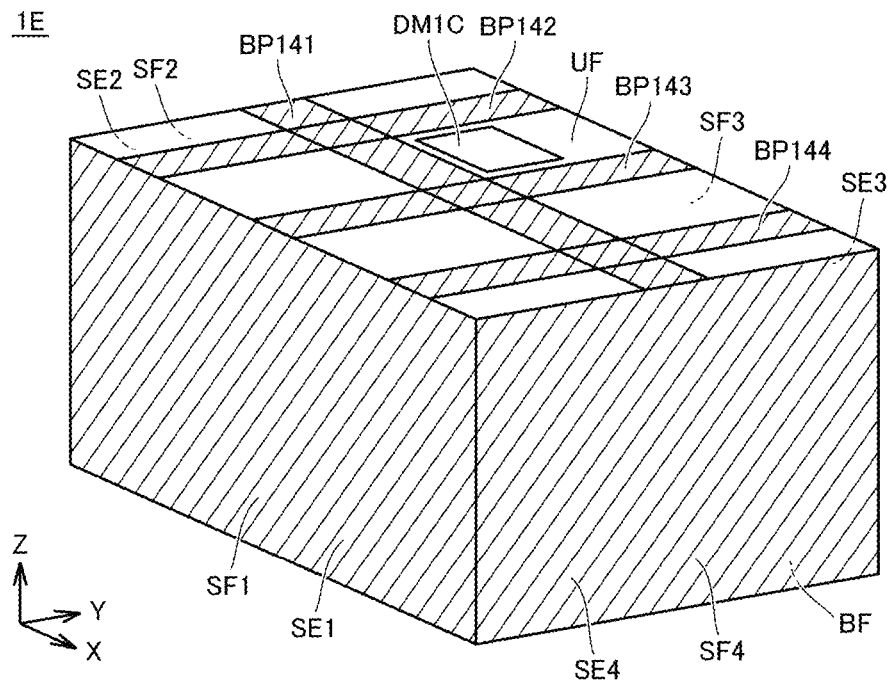
FIG. 13 is an external appearance perspective view of a low pass filter as an example of an electronic component according to a Modification 5 of the first preferred embodiment of the present invention.

Further, as in a low pass filter 1E illustrated in FIG. 13, a plurality of band-shaped conductor patterns are disposed in a lattice configuration on the upper surface UF and non-shielded areas are provided thereon. On the other hand, the side surfaces SF1 to SF4 may respectively be covered with shield electrodes SE1 to SE4, and no non-shielded area may be provided on any of the side surfaces SF1 to SF4. It is assumed that the low pass filter 1E is disposed close to other electronic components located in the X-axis direction and the Y-axis direction, for example, and it is necessary to reduce or prevent the entering of noise from the X-axis direction and Y-axis direction or the leakage of magnetic flux as required as much as possible. Therefore, the entire or substantially the entire area of each of the side surfaces SF1 to SF4 is covered with the shield electrodes SE1 to SE4, respectively.

In the first preferred embodiment, the plurality of band-shaped conductor patterns are disposed in a lattice configuration. In addition, the plurality of band-shaped conductor patterns are disposed on the shield surface in parallel or substantially in parallel to the sides of the electronic component. Further, the directions in which the band-shaped conductor patterns extend on the shield surface are divided into two directions, and the two directions are orthogonal or substantially orthogonal to each other. The configuration of the plurality of band-shaped conductor patterns is not limited to the configuration illustrated in the first preferred embodiment. The configuration of the plurality of band-shaped conductor patterns may be any configuration as long as a non-shielded area is provided on the surface other than the lower surface.

Figure 14:
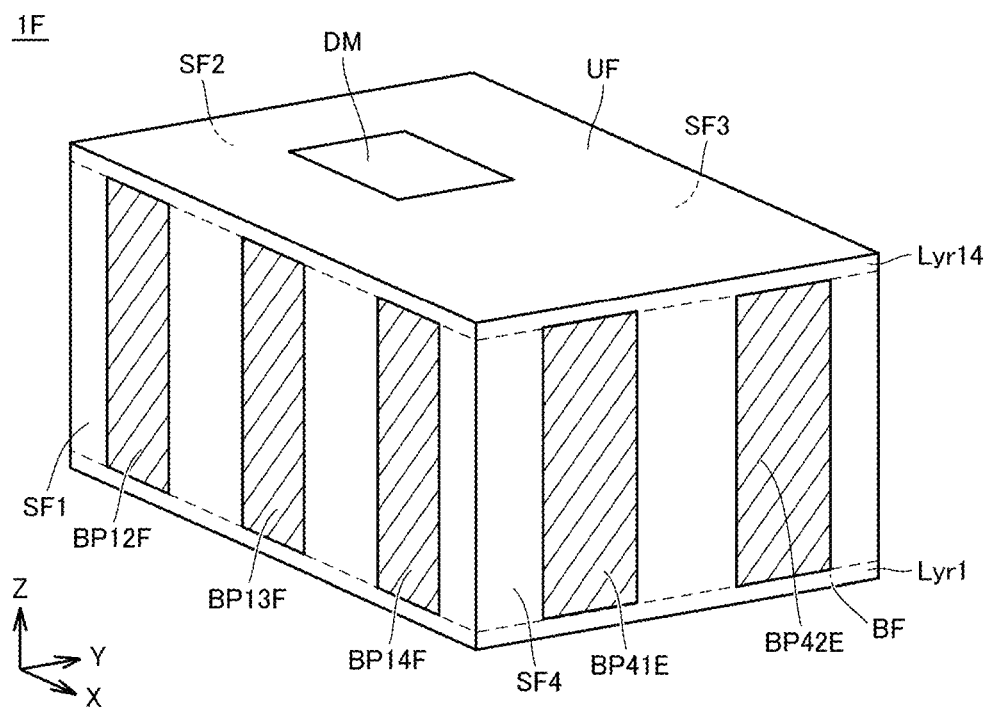
FIG. 14 is an external appearance perspective view of a low pass filter as an example of an electronic component according to a Modification 6 of the first preferred embodiment of the present invention.

For example, as in a low pass filter 1F illustrated in FIG. 14, a plurality of band-shaped conductor patterns may be disposed in parallel or substantially in parallel (stripe shaped) and spaced away from each other.

In the low pass filter 1, the plurality of band-shaped conductor patterns is disposed in a lattice configuration, so that the band-shaped conductor patterns intersect with each other. As a result, the plurality of band-shaped conductor patterns are connected on the shield surface, and the ground electrode is able to be shared. In the case in which the plurality of band-shaped conductor patterns are disposed in a stripe configuration as in the low pass filter 1F, the band-shaped conductor patterns do not intersect with each other on the shield surface. From the viewpoint of sharing the ground electrode, it is preferable to provide a conductor pattern that connects the plurality of band-shaped conductor patterns inside the electronic component.

Figure 15:
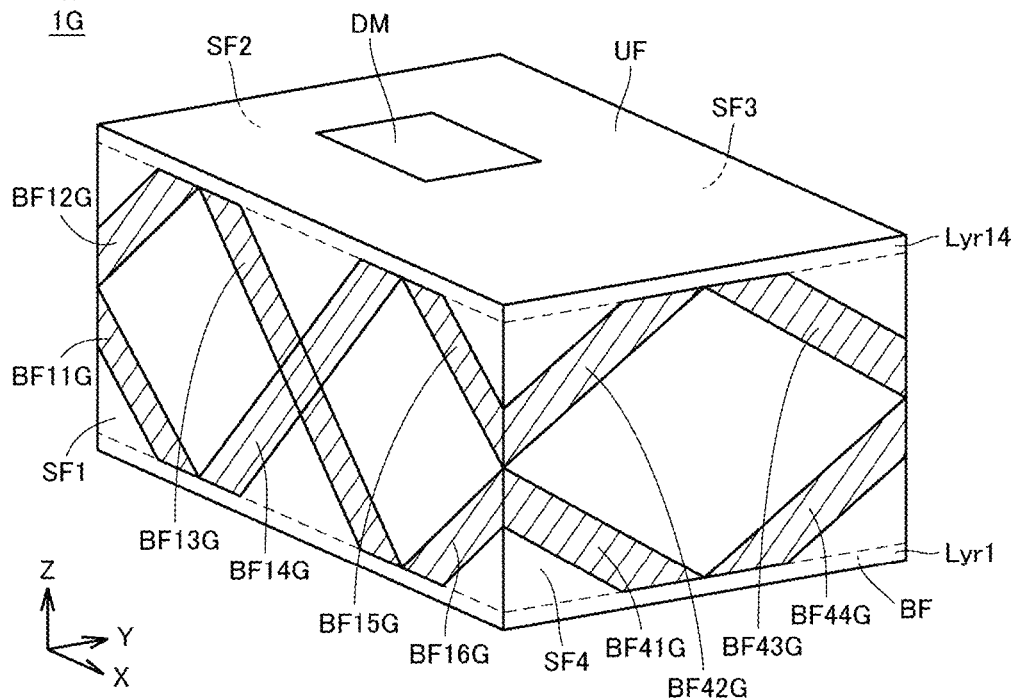
FIG. 15 is an external appearance perspective view of a low pass filter as an example of an electronic component according to a Modification 7 of the first preferred embodiment of the present invention.

Alternatively, as in a low pass filter 1G illustrated in FIG. 15, a plurality of band-shaped conductor patterns may be disposed on the shield surfaces obliquely with respect to sides of the low pass filter 1G.

Figure 16:
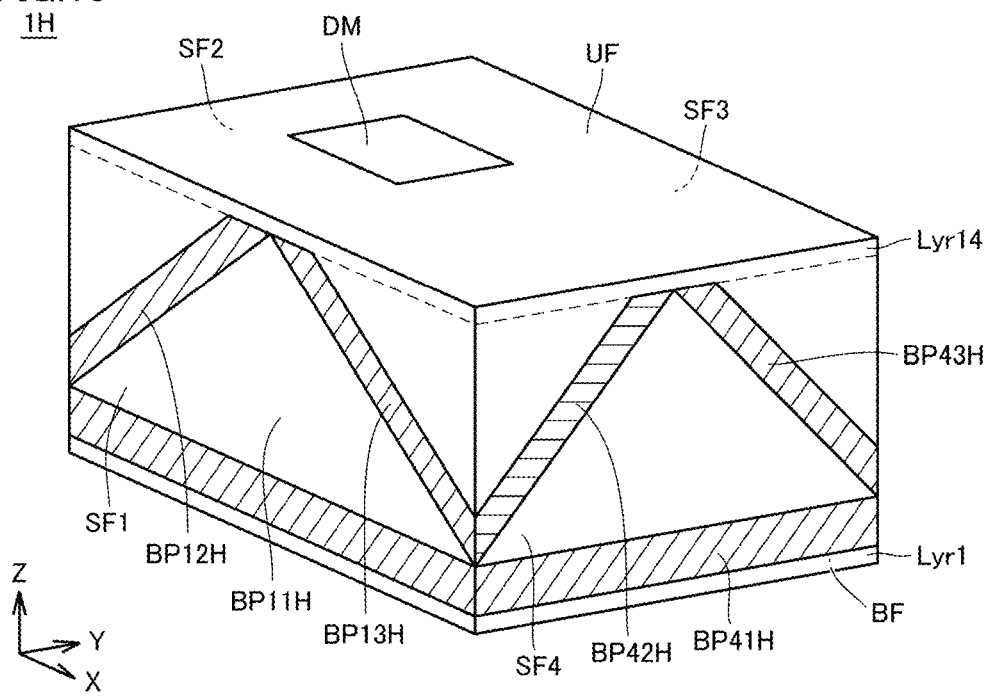
FIG. 16 is an external appearance perspective view of a low pass filter as an example of an electronic component according to a Modification 8 of the first preferred embodiment of the present invention.

Further, as in a low pass filter 1H illustrated in FIG. 16, the directions in which a plurality of band-shaped conductor patterns extends on the shield surface may be divided into three directions, and need not be orthogonal or substantially orthogonal to each other. The directions in which the plurality of band-shaped conductor patterns extend on the shield surface may be divided into four or more directions.

Figure 17:
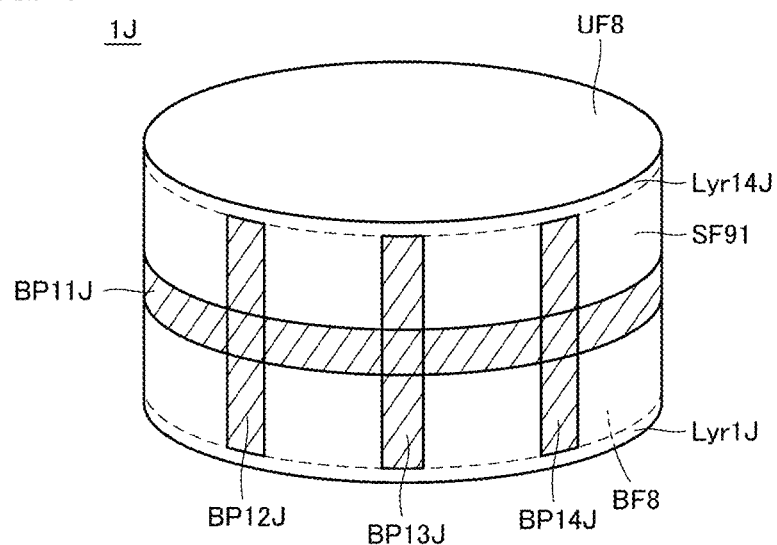
FIG. 17 is an external appearance perspective view of a low pass filter as an example of an electronic component according to a Modification 9 of the first preferred embodiment of the present invention.

In the first preferred embodiment, the electronic component preferably having a rectangular or substantially rectangular parallelepiped shape is described. The shape of an electronic component according to preferred embodiments of the present invention is not limited to a rectangular or substantially rectangular parallelepiped shape. The shape of an electronic component according to preferred embodiments of the present invention may have a cylindrical shape, such as a low pass filter 1J illustrated in FIG. 17, for example.

In the first preferred embodiment, in order to facilitate the design and manufacture of the electronic component, each of the plurality of dielectric layers preferably has the same dielectric constant. However, each of the plurality of dielectric layers need not have the same dielectric constant.

In the first preferred embodiment, the magnetic flux from the inductor L1 passes through the dielectric layer Lyr13, then passes through the band-shaped conductor pattern disposed on the internal surface DF, and is guided to the ground electrode. Therefore, the effective wavelength of the magnetic flux passing through the above band-shaped conductor pattern has a value obtained by dividing the wavelength of the magnetic flux by the dielectric constant of the dielectric layer Lyr13. Then, by making the dielectric constant of the dielectric layer Lyr13 smaller than that of each of the dielectric layers Lyr1 to Lyr12 in the first preferred embodiment, the effective wavelength of the magnetic flux passing through the band-shaped conductor pattern disposed on the internal surface DF is able to be made larger than that of the first preferred embodiment. Accordingly, by reducing the dielectric constant of the dielectric layer Lyr13 without changing the size of the low pass filter, the length of the path including the band-shaped conductor pattern disposed on the internal surface DF is able to be made smaller than about half of or about a quarter of the effective wavelength. As a result, it is possible to prevent the path from acting as an antenna.

According to Modifications 1 to 10 of the first preferred embodiment, it is possible to reduce or prevent the decrease in the Q value while ensuring the shielding effect.

Second Preferred Embodiment

In the first preferred embodiment, the winding axis of the inductor inside the electronic component is parallel or substantially parallel to the lamination direction. In a second preferred embodiment, a case in which a winding axis of an inductor inside an electronic component is perpendicular or substantially perpendicular to the lamination direction will be described.

Figure 18:
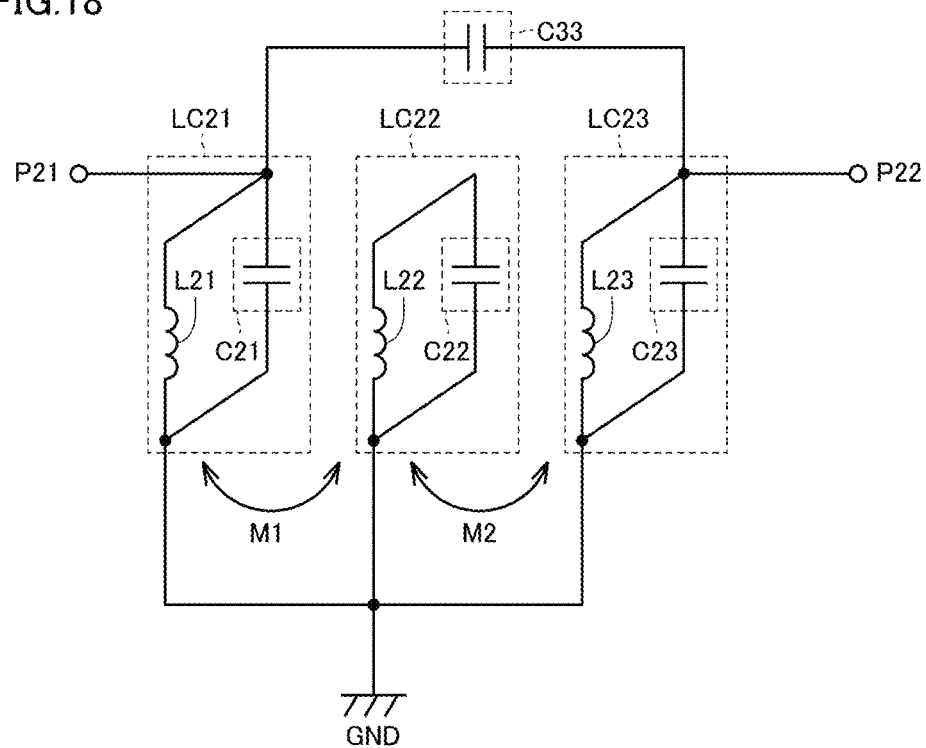
FIG. 18 is a circuit diagram of a band pass filter as an example of an electronic component according to a second preferred embodiment of the present invention.

FIG. 18 is a circuit diagram of a band pass filter 2 as an example of an electronic component according to a second preferred embodiment of the present invention. The band pass filter 2 is an electronic component that is mounted on a circuit board and includes a circuit pattern corresponding to the circuit illustrated in FIG. 18 therein.

As illustrated in FIG. 18, the band pass filter 2 includes an input-output terminal P21, an input-output terminal P22, an LC parallel resonator LC21, an LC parallel resonator LC22, an LC parallel resonator LC23 and a capacitor C33.

The LC parallel resonator LC21 includes an inductor L21 and a capacitor C21. The inductor L21 and the capacitor C21 are connected in parallel between the input-output terminal P21 and a ground point GND.

The LC parallel resonator LC23 includes an inductor L23 and a capacitor C23. The inductor L23 and the capacitor C23 are connected in parallel between the input-output terminal P22 and the ground point GND.

The LC parallel resonator LC22 includes an inductor L22 and a capacitor C22. The inductor L22 is connected to the capacitor C22. The inductor L22 and the capacitor C22 are connected to the ground point GND.

The capacitor C33 is connected between the input-output terminals P21 and P22.

Inductive coupling (magnetic coupling) M1 is generated between the LC parallel resonators LC21 and LC22 adjacent to each other. Inductive coupling M2 is generated between the LC parallel resonators LC22 and LC23 adjacent to each other.

Figure 19:
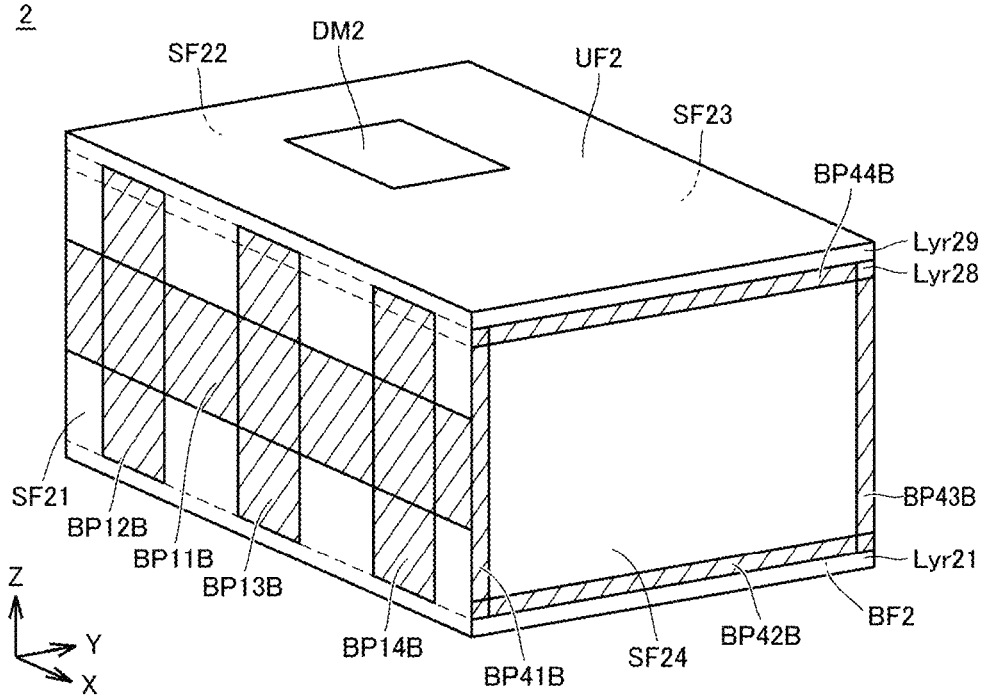
FIG. 19 is an external appearance perspective view of a band pass filter as an example of an electronic component according to the second preferred embodiment of the present invention.
Figure 20:
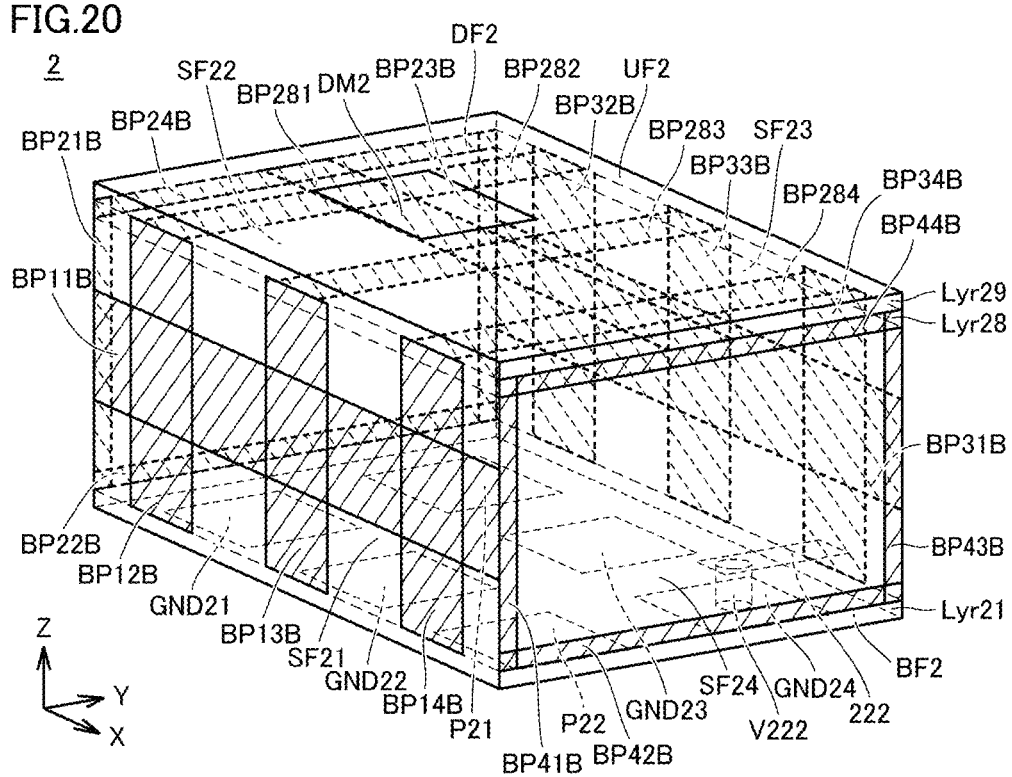
FIG. 20 is an external appearance see-through view of the band pass filter in FIG. 19.

FIG. 19 is an external appearance perspective view of the band pass filter 2 as an example of an electronic component according to the second preferred embodiment. FIG. 20 is an external appearance see-through view of the band pass filter 2 in FIG. 19. In FIG. 20, a circuit pattern provided inside the band pass filter 2 is not illustrated in order to prevent the drawing from being complicated. As will be explained below with reference to FIG. 21, the band pass filter 2 is a multilayer body in which a plurality of dielectric layers Lyr21 to Lyr29 are laminated in the Z-axis direction (lamination direction).

Referring to FIG. 19 and FIG. 20, the band pass filter preferably has, for example, a rectangular or substantially rectangular parallelepiped shape. Surfaces of the band pass filter 2 perpendicular or substantially perpendicular to the lamination direction are respectively referred to as a lower surface BF2 and an upper surface UF2. Of the surfaces parallel or substantially parallel to the lamination direction, surfaces parallel or substantially parallel to the Z-X plane are defined as side surfaces SF21 and SF23. Of the surfaces parallel to the lamination direction, surfaces parallel or substantially parallel to the Y-Z plane are defined as side surfaces SF22 and SF24.

On the lower surface BF2, the input-output terminals P21 and P22, and ground electrodes GND21 to GND24 are provided. The input-output terminals P21 and P22, and the ground electrodes GND21 to GRD24 are preferably, for example, LGA terminals defined by planar electrodes that are regularly disposed on the lower surface BF2. The lower surface BF2 is connected to a circuit board.

A direction identification mark DM2 is provided on the upper surface UF2. The direction identification mark DM2 is used to identify the direction of the band pass filter 2 at the mounting time.

BP11B to BP14B are disposed on the side surface SF21. BP21B to BP24B are disposed on the side surface SF22. BP31B to BP34B are disposed on the side surface SF23. BP41B to BP44B are disposed on the side surface SF24. BP281 to BP284 are disposed on an internal surface DF2. The internal surface DF2 is a surface at which the dielectric layer Lyr28 makes contact with the dielectric layer Lyr29. The side surfaces SF21 to SF24 and the internal surface DF2 correspond to shield surfaces. No shield electrode is provided on the side surfaces of the dielectric layer Lyr21 including the lower surface BF2 and the dielectric layer Lyr29 including the upper surface UF2.

The band-shaped conductor patterns BP11B to BP14B are disposed on the side surface SF21. The band-shaped conductor pattern BP11B extends in the X-axis direction. The band-shaped conductor patterns BP12B to BP14B are spaced away from each other in the X-axis direction. Each of the band-shaped conductor patterns BP12B to BP14B extends in the Z-axis direction. Each of the band-shaped conductor patterns BP12B to BP14B defines a cross shape with the band-shaped conductor pattern BP11B in a plan view from the Y-axis direction.

The band-shaped conductor patterns BP21B to BP24B are disposed on the side surface SF22. The band-shaped conductor patterns BP21B and BP23B extend in the Z-axis direction. The band-shaped conductor pattern BP21B is connected to the band-shaped conductor pattern BP11B. The band-shaped conductor patterns BP22B and BP24B extend in the Y-axis direction.

An area surrounded by the band-shaped conductor patterns BP21B to BP24B is a non-shielded area preferably having a rectangular or substantially rectangular shape, for example. By disposing the band-shaped conductor patterns BP21B to BP24B in this manner, in a plan view from the X-axis direction (a winding axis direction of the inductors L21 to L23 to be explained below), the band-shaped conductor patterns BP21B to BP24B do not overlap with an air-core section of each of the inductors L21 to L23 provided inside the band pass filter 2.

The band-shaped conductor patterns BP31B to BP34B are disposed on the side surface SF23. The band-shaped conductor pattern BP31B extends in the X-axis direction and is connected to the band-shaped conductor pattern BP23B. The band-shaped conductor patterns BP32B to BP34B are spaced away from each other in the X-axis direction. Each of the band-shaped conductor patterns BP32B to BP34B extends in the Z-axis direction. Each of the band-shaped conductor patterns BP32B to BP34B defines a cross shape with the band-shaped conductor pattern BP31B, respectively. The band-shaped conductor pattern BP34B is connected to the ground electrode GND24 via a line conductor pattern 222 and a via conductor pattern V222 provided inside the band pass filter.

The band-shaped conductor patterns BP41B to BP44B are disposed on the side surface SF24. The band-shaped conductor patterns BP41B and BP43B extend in the Z-axis direction. The band-shaped conductor pattern BP41B is connected to the band-shaped conductor pattern BP11B. The band-shaped conductor pattern BP43B is connected to the band-shaped conductor pattern BP31B. The band-shaped conductor patterns BP42B and BP44B extend in the Y-axis direction.

An area surrounded by the band-shaped conductor patterns BP41B to BP44B is a non-shielded area preferably having a rectangular or substantially rectangular shape, for example. By disposing the band-shaped conductor patterns BP41B to BP44B in this manner, in a plan view from the X-axis direction (the winding axis direction of the inductors L21 to L23 to be explained later), the band-shaped conductor patterns BP41B to BP44B do not overlap with the air-core section of each of the inductors L21 to L23 provided inside the band pass filter 2.

The band-shaped conductor patterns BP281 to BP284 are disposed on the internal surface DF2. The band-shaped conductor pattern BP281 extends in the X-axis direction and is connected to the band-shaped conductor patterns BP24B and BP44B. Each of the band-shaped conductor patterns BP282 to BP284 extends in the Y-axis direction. Each of the band-shaped conductor patterns BP282 to BP284 defines a cross shape with the band-shaped conductor pattern BP281. The band-shaped conductor pattern BP282 is connected to the band-shaped conductor patterns BP12B and BP32B. The band-shaped conductor pattern BP283 is connected to the band-shaped conductor patterns BP13B and BP33B. The band-shaped conductor pattern BP284 is connected to the band-shaped conductor patterns BP14B and BP34B.

Figure 21:
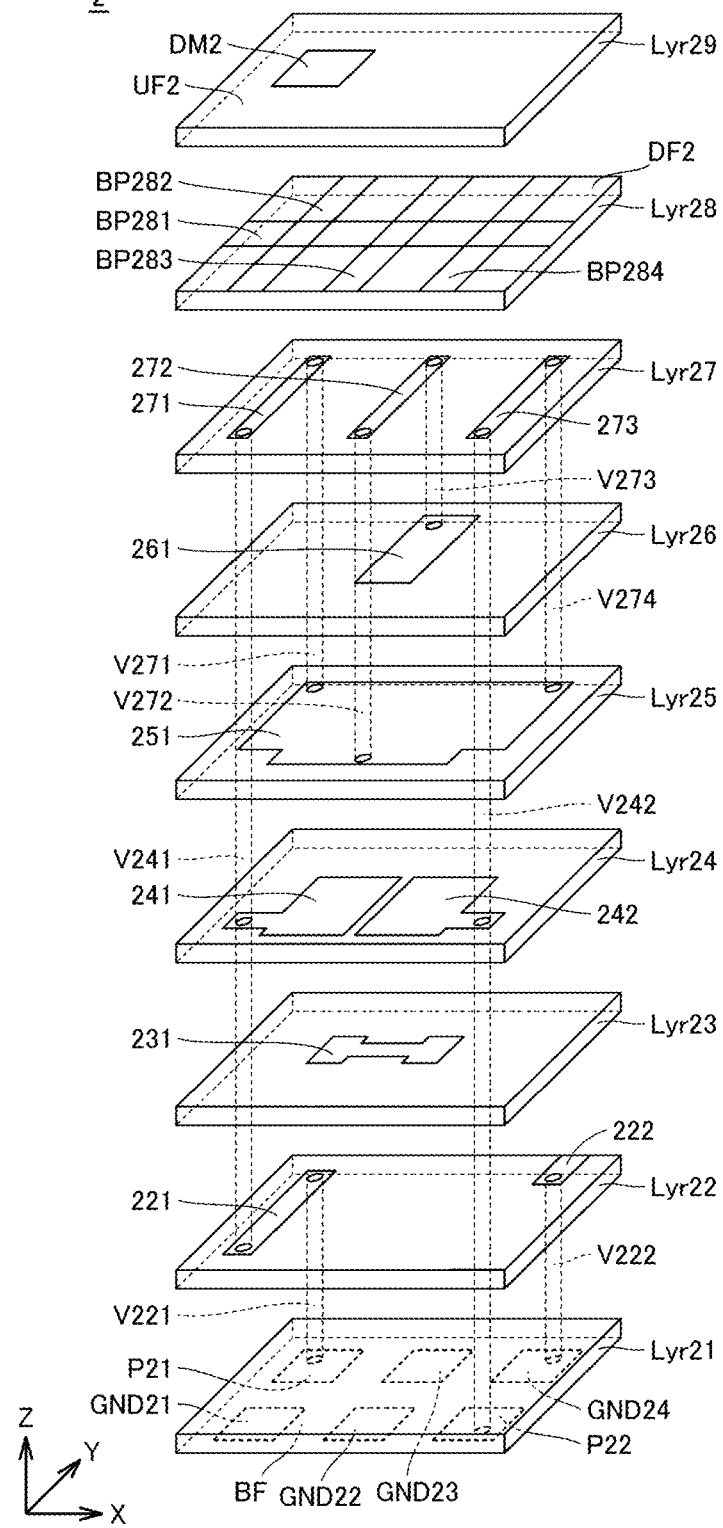
FIG. 21 is an exploded perspective view illustrating a lamination structure of the band pass filter in FIG. 19.

FIG. 21 is an exploded perspective view illustrating a lamination structure of the band pass filter 2 in FIG. 19. The band pass filter 2 includes the dielectric layers Lyr21 to Lyr29. The dielectric layers are laminated in order in the z-axis direction so that the dielectric layer Lyr21 is disposed on the lower surface BF2 side and the dielectric layer Lyr29 is disposed on the upper surface UF2 side.

As described above, the input-output terminals P21 and P22, and the ground electrodes GND21 to GND24 are provided on the lower surface BF2 of the dielectric layer Lyr21.

On the dielectric layer Lyr22, a line conductor pattern 221 and the line conductor pattern 222 are provided. The line conductor pattern 221 is connected to the input-output terminal P21 by a via conductor pattern V221. The line conductor pattern 222 is connected to the ground electrode GND24 by the via conductor pattern V222.

A capacitor conductor pattern 231 is provided on the dielectric layer Lyr23.

Capacitor conductor patterns 241 and 242 are provided on the dielectric layer Lyr24. The capacitor conductor pattern 241 is connected to the line conductor pattern 221 by a via conductor pattern V241. The capacitor conductor pattern 242 is connected to the input-output terminal P22 by a via conductor pattern V242.

Each of the capacitor conductor patterns 241 and 242 overlaps with the capacitor conductor pattern 231 in a plan view from the lamination direction. The capacitor conductor patterns 231, 241 and 242 define the capacitor C33.

A capacitor conductor pattern 251 is provided on the dielectric layer Lyr25. The capacitor conductor pattern 251 overlaps with the capacitor conductor patterns 241 and 242 in a plan view from the lamination direction. The capacitor conductor patterns 241 and 251 define the capacitor C21. The capacitor conductor patterns 242 and 251 define the capacitor C23.

A capacitor conductor pattern 261 is provided on the dielectric layer Lyr26. The capacitor conductor pattern 261 overlaps with the capacitor conductor pattern 251 in the plan view from the lamination direction. The capacitor conductor patterns 251 and 261 define the capacitor C22.

On the dielectric layer Lyr27, line conductor patterns 271 to 273 are provided. The line conductor pattern 271 is connected to the capacitor conductor pattern 241 by the via conductor pattern V241. The line conductor pattern 271 is connected to the capacitor conductor pattern 251 by a via conductor pattern V271. The line conductor pattern 271 and the via conductor patterns V241 and V271 define the inductor L21. The inductor L21 is wound around the winding axis perpendicular or substantially perpendicular to the lamination direction.

The line conductor pattern 272 is connected to the capacitor conductor pattern 251 by a via conductor pattern V272. The line conductor pattern 272 is connected to the capacitor conductor pattern 261 by a via conductor pattern V273. The line conductor pattern 272 and the via conductor patterns V272 and V273 define the inductor L22. The inductor L22 is wound around the winding axis perpendicular or substantially perpendicular to the lamination direction.

The line conductor pattern 273 is connected to the capacitor conductor pattern 242 by the via conductor pattern V242. The line conductor pattern 273 is connected to the capacitor conductor pattern 251 by a via conductor pattern V274. The line conductor pattern 273 and the via conductor patterns V242 and V274 define the inductor L23. The inductor L23 is wound around the winding axis perpendicular or substantially perpendicular to the lamination direction.

As described above, the band-shaped conductor patterns BP281 to BP284 are provided on the internal surface DF2 of the Lyr28. The internal surface DF2 is located between the upper surface UF2 and the circuit pattern.

As described above, the direction identification mark DM2 is provided on the Lyr29.

In a plan view from the winding axis direction of the inductors L21 to L23, the entire or substantially the entire area of the air-core section of each of the inductors L21 to L23 overlaps with the non-shielded area, respectively.

As described above, in the second preferred embodiment, the plurality of band-shaped conductor patterns are provided as shield electrodes, to define the non-shielded areas on the shield surfaces. With this structure, it is possible to obtain the balance between the shielding effect and the Q value, and to reduce or prevent the decrease in the Q value while securing the shielding effect.

Further, in the second preferred embodiment, since the entire or substantially the entire area of the air-core section of the inductor overlaps with the non-shielded area in a plan view from the winding axis direction of the inductor, it is possible to further reduce or prevent a decrease in Q value due to the magnetic flux being blocked by the shield electrode disposed on the surface parallel or substantially parallel to the winding axis of the inductor.

Third Preferred Embodiment

In the first preferred embodiment and the second preferred embodiment, a case in which a plurality of band-shaped conductor patterns are disposed on shield surfaces so as to define non-shielded areas is provided. The non-shielded area may be provided without using a plurality of band-shaped conductor patterns. In a third preferred embodiment, a case will be described in which a plurality of holes are provided in a planar shield electrode so as to define a non-shielded area.

A third preferred embodiment of the present invention differs from the first preferred embodiment in that a plurality of holes are provided in a planar shield electrode so as to define a non-shielded area. Since the remaining configuration is the same as or similar to that of the first preferred embodiment, description thereof will not be repeated.

Figure 22:
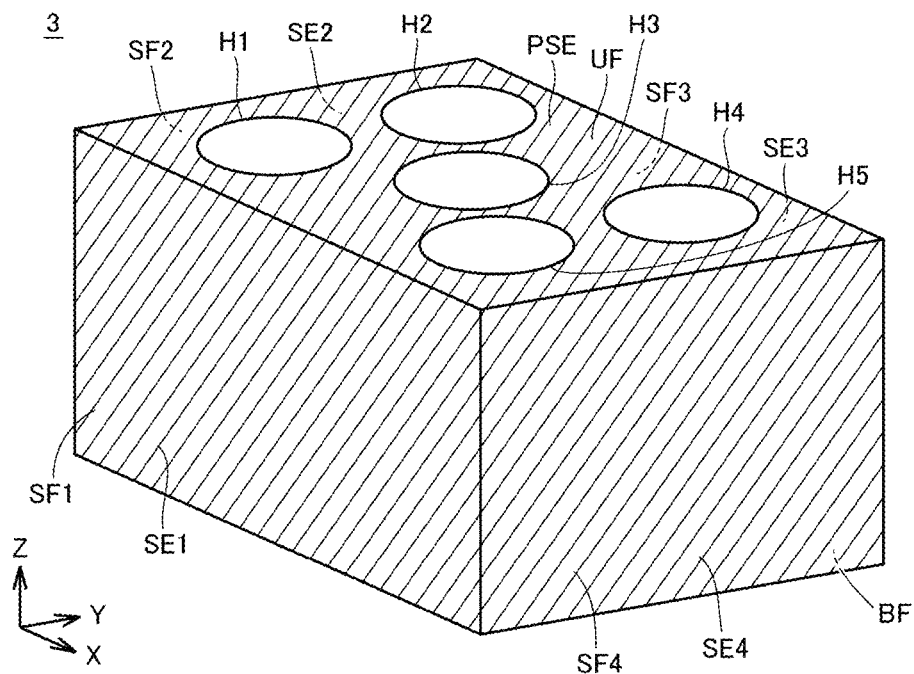
FIG. 22 is an external appearance perspective view of a low pass filter as an example of an electronic component according to a third preferred embodiment of the present invention.

FIG. 22 is an external appearance perspective view of a low pass filter 3 as an example of an electronic component according to the third preferred embodiment. As illustrated in FIG. 22, shield electrodes SE1 and SE4 are disposed on side surfaces SF1 and SF4 of the low pass filter 3, respectively. Although not illustrated in the drawing, shield electrodes SE2 and SE3 are disposed on side surfaces SF2 and SF3, respectively. The entire or substantially the entire area of each of the side surfaces SF1 to SF4 is covered with the shield electrodes SE1 to SE4.

On an upper surface UF, a shield electrode PSE is disposed. Porosities H1 to H5 are provided in the shield electrode PSE. Each of the areas in which the porosities H1 to H5 are provided in the upper surface UF is a non-shielded area. The shield electrode PSE corresponds to a partial shield portion.

Figure 23:
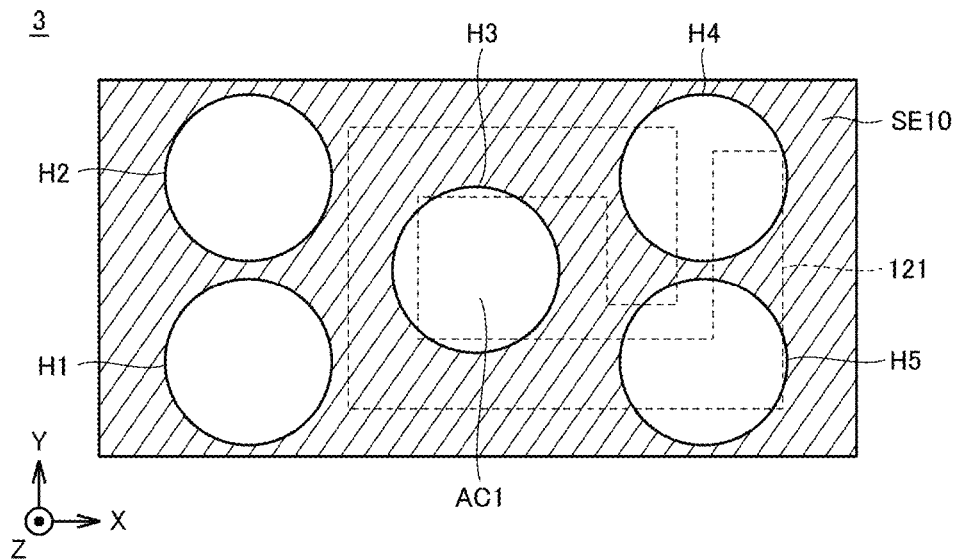
FIG. 23 is a diagram illustrating a see-through view of the low pass filter in FIG. 22 in a plan view from a winding axis direction (lamination direction) of an inductor.

FIG. 23 is a diagram illustrating a see-through view of the low pass filter 3 in FIG. 22 in a plan view from a winding axis direction (lamination direction) of an inductor L1. As illustrated in FIG. 23, in the low pass filter 3, an air-core section AC1 of the inductor L1 overlaps with a non-shielded area surrounded by the porosity H3.

As described above, in the third preferred embodiment, by providing a porosity in a shield electrode, a non-shielded area surrounded by the porosity is provided in a shield surface. As a result, it is possible to obtain the balance between the shielding effect and the Q value, and to reduce or prevent the decrease in the Q value while ensuring the shielding effect.

Further, according to the third preferred embodiment, since the position and size of the porosities is able to be adjusted flexibly in accordance with a circuit pattern of the electronic component, non-shielded areas are able to be provided in accordance with the circuit pattern, as compared with the first preferred embodiment in which non-shielded areas are defined by band-shaped conductor patterns.

Moreover, according to the third preferred embodiment, since the leakage of magnetic flux in the winding axis direction of the inductor is allowed to some extent, the decrease in the Q value is able to be reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a multilayer body including a plurality of dielectric layers;
    a circuit pattern disposed inside the multilayer body and including a conductor pattern defining an inductor; and
    a plurality of band-shaped conductor patterns that are grounded; wherein
    the multilayer body includes an upper surface, a lower surface opposing the upper surface, a side surface connecting the upper surface and the lower surface, and an internal surface located between the circuit pattern and the upper surface and parallel or substantially parallel to the upper surface;
    the plurality of band-shaped conductor patterns cover a portion of the multilayer body to define a shield surface including at least one of the upper surface, the side surface, and the internal surface;

the plurality of band-shaped conductor patterns include a first band-shaped conductor pattern extending in a first direction and a second band-shaped conductor pattern extending in a second direction different from the first direction; and a non-shielded area is provided on the shield surface which is not covered with any of the plurality of band-shaped conductor patterns, and through which magnetic flux generated from the inductor is able to pass.

2. The electronic component according to claim 1, wherein the first direction and the second direction are orthogonal or substantially orthogonal to each other.

3. The electronic component according to claim 1, wherein the inductor is wound around a winding axis;

the shield surface is perpendicular or substantially perpendicular to the winding axis; and at least a portion of an area of an air-core section of the inductor overlaps with the non-shielded area in a plan view from a direction of the winding axis.

4. The electronic component according to claim 3, wherein an entire or substantially an entire area of the air-core section overlaps with the non-shielded area in the plan view from the direction of the winding axis.

5. The electronic component according to claim 3, wherein the winding axis is parallel or substantially parallel to a lamination direction of the plurality of dielectric layers.

6. The electronic component according to claim 1, wherein the shield surface includes the upper surface.

7. The electronic component according to claim 1, wherein the shield surface includes the internal surface.

8. The electronic component according to claim 3, wherein the winding axis is perpendicular or substantially perpendicular to a lamination direction of the plurality of dielectric layers.

9. The electronic component according to claim 1, wherein the shield surface includes the side surface.

10. The electronic component according to claim 1, further comprising:

a plurality of ground electrodes disposed on the lower surface; wherein each of the plurality of dielectric layers has the same dielectric constant;

each of the plurality of band-shaped conductor patterns is connected to any of the plurality of ground electrodes;

the plurality of ground electrodes include a first ground electrode and a second ground electrode; and a distance of a path from the first ground electrode to the second ground electrode via the plurality of band-shaped conductor patterns is smaller than about half of an effective wavelength obtained by dividing a wavelength of assumed noise by the dielectric constant.

11. The electronic component according to claim 1, further comprising:

a ground electrode disposed on the lower surface; wherein each of the plurality of dielectric layers has the same dielectric constant;

each of the plurality of band-shaped conductor patterns is connected to the ground electrode; and a distance of a path from the ground electrode to an open end of the plurality of band-shaped conductor patterns via the plurality of band-shaped conductor patterns is smaller than about a quarter of an effective wavelength obtained by dividing a wavelength of an assumed noise by the dielectric constant.

12. The electronic component according to claim 1, wherein the shield surface includes at least one of the upper surface and the internal surface;

the plurality of dielectric layers includes a first dielectric layer including the shield surface and a second dielectric layer on which the conductor pattern is provided; and a dielectric constant of the first dielectric layer is smaller than a dielectric constant of the second dielectric layer.

\* \* \* \* \*